US010770139B2

(12) United States Patent
Kim et al.

(10) Patent No.: US 10,770,139 B2
(45) Date of Patent: Sep. 8, 2020

(54) VARIABLE RESISTANCE MEMORY DEVICE AND OPERATING METHOD THEREOF

(71) Applicant: KOREA RESEARCH INSTITUTE OF CHEMICAL TECHNOLOGY, Daejeon (KR)

(72) Inventors: Gun Hwan Kim, Daejeon (KR); Young Kuk Lee, Daejeon (KR); Taek Mo Chung, Daejeon (KR); Bo Keun Park, Daejeon (KR); Jeong Hwan Han, Daejeon (KR); Ji Woon Choi, Gunpo-si (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 0 days.

(21) Appl. No.: 15/968,038

(22) Filed: May 1, 2018

(65) Prior Publication Data

US 2018/0342297 A1 Nov. 29, 2018

(30) Foreign Application Priority Data

May 25, 2017 (KR) .......................... 10-2017-0064484

(51) Int. Cl.
*G11C 13/00* (2006.01)
*G11C 11/56* (2006.01)
(Continued)

(52) U.S. Cl.
CPC .......... *G11C 13/0069* (2013.01); *G11C 11/56* (2013.01); *G11C 11/5628* (2013.01);
(Continued)

(58) Field of Classification Search
CPC ............ G11C 11/5685; G11C 13/0069; G11C 2013/0073; G11C 2013/0076;
(Continued)

(56) References Cited

U.S. PATENT DOCUMENTS 8,406,035 B2 * 3/2013 Katoh ..................... G11C 11/14
365/148
8,830,727 B2 * 9/2014 Yi ........................... G11C 11/56
365/148
(Continued)

FOREIGN PATENT DOCUMENTS

JP 2013-69869 A 4/2013
KR 10-2013-0091551 A 8/2013
(Continued)

OTHER PUBLICATIONS

Gun Hwan Kim et al., "Four-Bits-Per-Cell Operation in an HfO2-Based Resistive Switching Device", Advanced Science News, Aug. 30, 2017.
(Continued)

*Primary Examiner* — Vanthu T Nguyen
(74) *Attorney, Agent, or Firm* — Stein IP, LLC

(57) ABSTRACT

There are provided a variable resistance memory device and an operating method thereof. In a method for operating a variable resistance memory device, the method includes programming multi-bit data in a multi-bit variable resistance memory cell of the variable resistance memory device, wherein the programming includes: generating sequentially increased program voltage pulses, based on the multi-bit data; and applying the program voltage pulses to the multi-bit variable resistance memory cell, wherein a current-voltage curve of the multi-bit variable resistance memory cell exhibits a self-compliance characteristic, wherein the program voltage pulses are included in a voltage section having the self-compliance characteristic.

13 Claims, 18 Drawing Sheets

(51) Int. Cl.
*H01L 27/24* (2006.01)
*H01L 45/00* (2006.01)

(52) U.S. Cl.
CPC ........ *G11C 11/5678* (2013.01); *G11C 13/004* (2013.01); *G11C 13/0064* (2013.01); *G11C 13/0038* (2013.01); *G11C 2013/0078* (2013.01); *G11C 2213/31* (2013.01); *G11C 2213/32* (2013.01); *G11C 2213/34* (2013.01); *H01L 27/24* (2013.01); *H01L 45/145* (2013.01); *H01L 45/146* (2013.01); *H01L 45/147* (2013.01)

(58) Field of Classification Search
CPC ...... G11C 2013/0078; G11C 2013/009; G11C 2013/0092; G11C 13/0064
See application file for complete search history.

(56) References Cited

U.S. PATENT DOCUMENTS

| | | | | |
|---|---|---|---|---|
| 8,929,124 | B2* | 1/2015 | Kim | G11C 13/0069 365/148 |
| 8,947,905 | B2* | 2/2015 | Chang | G11C 11/5685 365/148 |
| 8,958,233 | B2 | 2/2015 | Chen | 365/145 |
| 9,552,879 | B2* | 1/2017 | Lee | G11C 13/0069 |
| 9,558,822 | B2* | 1/2017 | Park | G11C 13/0069 |
| 9,941,006 | B1* | 4/2018 | Arayashiki | G11C 13/0069 |
| 2010/0027326 | A1* | 2/2010 | Kim | G11C 13/0069 365/163 |
| 2013/0058153 | A1* | 3/2013 | Chang | G11C 13/0007 365/148 |
| 2015/0243355 | A1* | 8/2015 | Lee | G11C 13/0069 365/148 |
| 2016/0284403 | A1 | 9/2016 | Navon et al. | 13/69 |

FOREIGN PATENT DOCUMENTS

| | | |
|---|---|---|
| KR | 10-2014-0035558 A | 3/2014 |
| KR | 10-2016-0001428 A | 1/2016 |
| KR | 10-2016-0050400 A | 5/2016 |

OTHER PUBLICATIONS

Cong Ye et al., "Low-power bipolar resistive switching TiN/HfO2/ITO memory with self-compliance current phenomenon", Applied Physics Express 7, Feb. 10, 2014.
Xiao-Ping Gao et al., "Self-compliance multilevel storage characteristic in HfO2-based device", Chin. Phys. B, vol. 25, No. 10, Aug. 25, 2016.
Amit Prakash et al., "Multilevel Cell Storage and Resistance Variability in Resistive Random Access Memory", Physical Sciences Reviews, vol. 1, Issue 6, Jun. 30, 2016.
Korean Office Action dated Oct. 15, 2018, issued to Korean Application No. 10-2017-0064484.
H.S. Philip Wong et al., 'Metal-Oxide RRAM', Proceedings of the IEEE, vol. 100, No. 6, Jun. 2012.
Qing Luo et al., 'Demonstration of 3D vertical RRAM with ultra low-leakage, high-selectivity and self-compliance memory cells', 2015 IEEE IEDM, Dec. 2015.
Office Action issued by the Korean Intellectual Property Office dated Apr. 18, 2019 for Korean Application No. 10-2017-0064484 filed on May 25, 2017.

* cited by examiner

VARIABLE RESISTANCE MEMORY DEVICE AND OPERATING METHOD THEREOF

CROSS-REFERENCE TO RELATED APPLICATION

The present application claims priority under 35 U.S.C. § 119(a) to Korean patent application 10-2017-0064484 filed on May 25, 2017, in the Korean Intellectual Property Office, the entire disclosure of which is incorporated herein by reference.

BACKGROUND

1. Technical Field

An aspect of the present disclosure relates to a semiconductor memory device, and more particularly, to a variable resistance memory device and an operating method thereof.

2. Related Art

Semiconductor memory device are generally classified into volatile memory devices and nonvolatile memory devices. The volatile memory devices have a fast read and write speed, but lose stored data when a power supply is cut off. On the other hand, the nonvolatile memory devices retain stored data even when a power supply is cut off. Therefore, the nonvolatile memory devices are used to store data to be retained regardless of whether a power supply has been supplied.

Recently, demands for nonvolatile semiconductor memory devices that can realize high integration and large capacity have gradually increased. A representative of such memory devices is a flash memory device frequently used for current portable electronic devices and the like. However, demands for nonvolatile memory devices that can perform random access and realize high capacity and high integration are still increasing. For example, the nonvolatile memory devices are a Ferroelectric RAM (FRAM) using a ferroelectric capacitor, a Magnetic RAM (MRAM) using a Tunneling Magneto-Resistive (TMR), a phase change memory device, and a Resistive RAM (RRAM) using a variable resistance material layer as a data storage medium.

In particular, memory characteristics such as high speed, large capacity, and low power are expected in the RRAM. The variable resistance material layer of the RRAM exhibits a reversible resistance change based on a polarity and amplitude of an applied pulse. A Colossal Magnetro-Resistive (CMR) material layer with a Perovskite structure or a metal oxide layer in which a conductive filament is created or removed by an electric pulse has been proposed as the variable resistance material layer.

SUMMARY

Embodiments provide a variable resistance memory device having high reliability and high capacity, and an operating method of the variable resistance memory device.

According to an aspect of the present disclosure, there is provided a method for operating a variable resistance memory device, the method including programming multi-bit data in a multi-bit variable resistance memory cell of the variable resistance memory device, wherein the programming includes: generating sequentially increased program voltage pulses, based on the multi-bit data; and applying the program voltage pulses to the multi-bit variable resistance memory cell, wherein a current-voltage curve of the multi-bit variable resistance memory cell exhibits a self-compliance characteristic, wherein the program voltage pulses are included in a voltage section having the self-compliance characteristic.

According to an aspect of the present disclosure, there is provided a variable resistance memory device including: a variable resistance memory cell configured to store multi-bit data; a voltage generator configured to generate sequentially increased program voltage pulses, based on the multi-bit data; a program circuit configured to apply the program voltage pulses to the variable resistance memory cell; and a read circuit configured to perform a verify read operation on the variable resistance memory cell, wherein a current-voltage curve of the variable resistance memory cell exhibits a self-compliance characteristic, wherein the program voltage pulses are included in a voltage section having the self-compliance characteristic, wherein the read circuit is configured to determine the verify read operation as program pass when a read current of the variable resistance memory cell is larger than a minimum current limit and is smaller than a maximum current limit.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The advantages and features of the present invention, and the way of attaining them, will become apparent with reference to embodiments described below in conjunction with the accompanying drawings. However, the present disclosure is not limited to the embodiments disclosed below and will be embodied in a variety of different forms; rather, these embodiments are provided so that this disclosure will be thorough and complete, and will fully convey the scope of the present disclosure to those skilled in the art, and the scope of the present disclosure will be defined by the appended claims.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
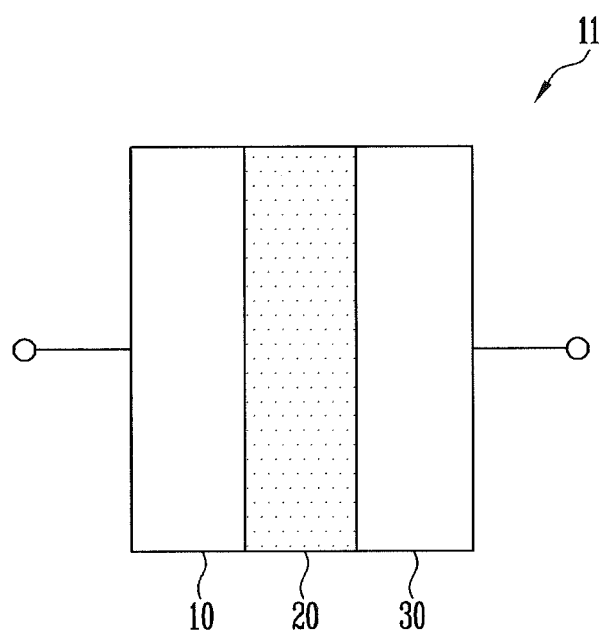
FIG. 1 is a view illustrating a variable resistance element.

FIG. 1 is a view illustrating a variable resistance element.

Referring to FIG. 1, the variable resistance element 11 includes a pair of electrodes 10 and 30, and a data storage layer 20 formed between the electrodes 10 and 30.

The electrodes 10 and 30 constituting the variable resistance element 11 may be formed of various metals, metal oxides or metal nitrides. The electrodes 10 and 30 may include at least one of aluminum (Al), copper (Cu), titanium nitride (TiN), titanium aluminum nitride ($Ti_xAl_yN_x$), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), and oxide strontium zirconate ($StZrO_3$).

Data storage layer 20 may be formed of a bipolar resistance memory material or a unipolar resistance memory material. The bipolar resistance memory material may be programmed to a set or reset state by the polarity of a voltage or current pulse. The unipolar resistance memory material may be programmed to a set or reset state by a pulse having the same polarity. The unipolar resistance memory material may include a single transition metal oxide (TMO) such as $NiO_x$ or $TiO_x$. Perovskite-based materials may be used as the bipolar resistance memory material.

FIGS. 2A to 2D are other embodiments of the variable resistance element.

Figure 2A:
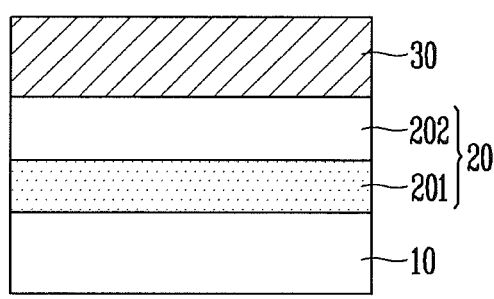
FIGS. 2A to 2D are other embodiments of the variable resistance element.

Referring to FIG. 2A, the data storage layer 20 of FIG. 1 may include a variable resistance layer 201 and an insulating layer 202. The variable resistance layer 201 may include at least one selected from the group consisting of an aluminum oxide layer ($AlO_x$), an aluminum oxynitride layer ($AlO_xN_y$), a silicon oxide layer ($SiO_x$), a silicon nitride layer ($SiN_x$), a silicon oxynitride layer ($SiO_xN_y$), a hafnium oxide layer ($HfO_x$), a zirconium oxide layer ($ZrO_x$), a titanium oxide layer ($TiO_x$), a lanthanum oxide layer ($LaO_x$), a strontium oxide layer ($SrO_x$), an aluminum-doped titanium oxide layer (Al-doped $TiO_x$), a hafnium silicon oxide layer ($HfSiO_x$), and a hafnium silicon oxynitride layer ($HfSiO_xN_y$).

The insulating layer 202 may be a single layer or be configured with a plurality of insulating layers having different dielectric constants.

Figure 2B:
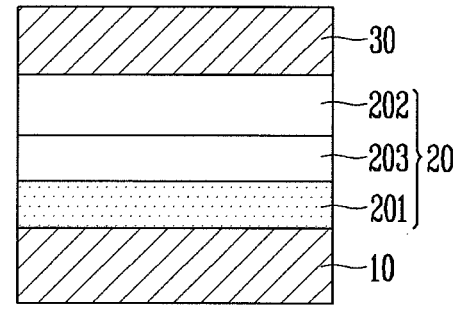

Referring to FIG. 2B, the variable resistance element 11 may include an oxygen exchange layer 203 interposed between the variable resistance layer 201 and the insulating layer 202. The oxygen exchange layer 203 may be in contact with the variable resistance layer 201. The oxygen exchange layer 203 is a layer that exchanges oxygen with the variable resistance layer 201. When the variable resistance element 11 is set, a portion of oxygen included in the variable resistance layer 201 moves to the oxygen exchange layer 203, and therefore, the electric resistance of the variable resistance layer 201 may be in a low resistance state (LRS). Alternatively, when the variable resistance element 11 is reset, oxygen included in the oxygen exchange layer 203 moves to the variable resistance layer 201, and therefore, the electric resistance of the variable resistance layer 201 may be in a high resistance state (HRS). The oxygen exchange layer 203 may be formed of an oxide including the same transition metal as the variable resistance layer 201. For example, the oxygen exchange layer 203 may include an oxide of at least one metal selected from the group consisting of zirconium (Zr), hafnium (Hf), aluminum (Al), nickel (Ni), copper (Cu), molybdenum (Mo), tantalum (Ta), titanium (Ti), and tungsten (W).

Figure 2C:
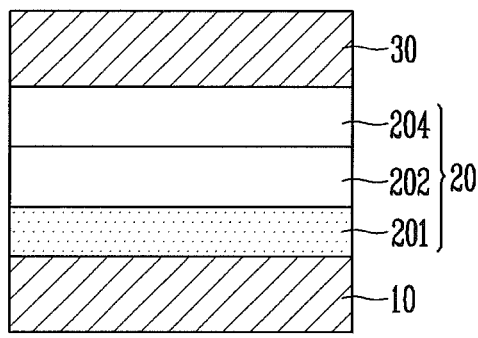

Referring to FIG. 2C, the variable resistance element 11 may include an additional insulating layer 204 interposed between the insulating layer 202 and the electrode 30. The additional insulating layer 204 may include at least one selected from the group consisting of an aluminum oxide layer ($AlO_x$), an aluminum oxynitride layer ($AlO_xN_y$), a silicon oxide layer ($SiO_x$), a silicon nitride layer ($SiN_x$), a silicon oxynitride layer ($SiO_xN_y$), a hafnium oxide layer ($HfO_x$), a zirconium oxide layer ($ZrO_x$), a titanium oxide layer ($TiO_x$), a lanthanum oxide layer ($LaO_x$), a strontium oxide layer ($SrO_x$), an aluminum-doped titanium oxide layer (Al-doped $TiO_x$), a hafnium silicon oxide layer ($HfSiO_x$), and a hafnium silicon oxynitride layer ($HfSiO_xN_y$).

Figure 2D:
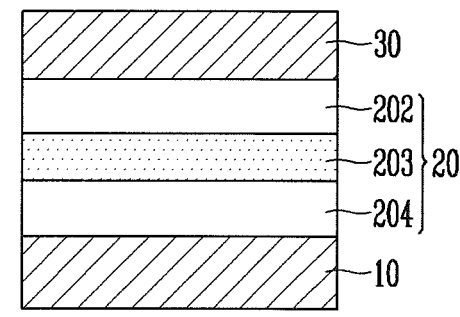

Referring to FIG. 2D, the additional insulating layer 204 may be interposed between the oxygen exchange layer 203 and the electrode 10.

Figure 3A:
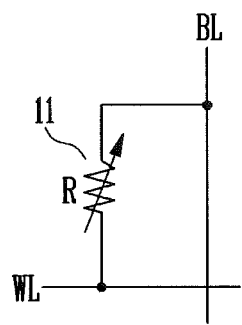
FIGS. 3A to 3F are views illustrating structures of variable resistance memory cells according to the present disclosure.
Figure 3B:
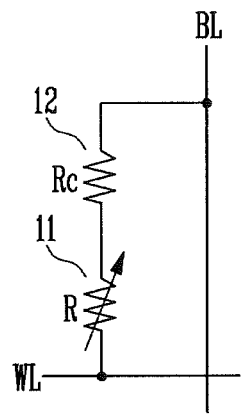

FIGS. 3A to 3F are views illustrating structures of variable resistance memory cells according to the present disclosure. Variable resistance memory cells having no selection element are illustrated in FIGS. 3A and 3B, and variable resistance memory cells having selection elements are illustrated in FIGS. 3C to 3F.

Referring to FIG. 3A, the variable resistance memory cell includes a variable resistance element 11 coupled to a bit line BL and a word line WL. In the variable resistance memory cell having such structure in which there is no selection element, data may be programmed based on the magnitude of a voltage applied between the bit line BL and the word line WL. The variable resistance element 11 may autonomously exhibit a self-compliance current-voltage characteristic. This will be described in detail below.

Referring to FIG. 3B, the variable resistance memory cell may include a variable resistance element 11 and a resistance element Rc 12. The resistance element 12 may be a resistance element that maintains a constant resistance value. The variable resistance element 11 of FIG. 3B may not autonomously exhibit the self-compliance current-voltage characteristic. Instead, the variable resistance memory cell of FIG. 3B may exhibit the self-compliance current-voltage characteristic due to coupling of the variable resistance element 11 and the resistance element 12.

Figure 3C:
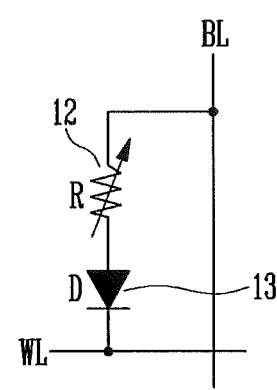

Referring to FIG. 3C, the variable resistance memory cell may include a variable resistance element 11 and a diode D 13. The variable resistance element 11 may include a variable resistance material for storing data. The diode 13 is a selection element (or switching element) that supplies or blocks a current to the variable resistance element 11 according to a bias of a word line WL and a bit line BL. The diode 13 may be coupled between the variable resistance element 11 and the word line WL, and the variable resistance element 11 may be coupled between the bit line BL and the diode 13. The positions of the diode 13 and the variable resistance element 11 may be reversed. In other words, the diode 13 may be coupled between the variable resistance element 11 and the bit line BL, and the variable resistance element 11 may be coupled between the word line WL and the diode 13. The diode 13 may be turned on or turned off according to a voltage of the word line WL. The variable resistance element 11 of FIG. 3C may autonomously exhibit the self-compliance current-voltage characteristic as shown in FIG. 3A.

Figure 3D:
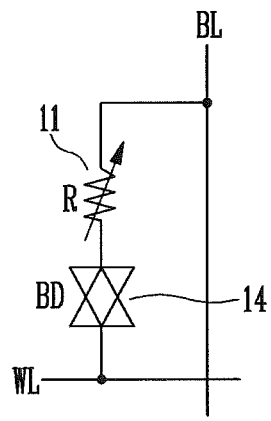

Referring to FIG. 3D, the variable resistance memory cell may include a variable resistance element 11 and a bidirectional diode BD 14. The variable resistance element 11 may include a variable resistance material for storing data. The bidirectional diode 14 is coupled between the variable resistance element 11 and a word line WL, and the variable resistance element 11 is coupled between a bit line BL and the bidirectional diode 14. The positions of the bidirectional diode 14 and the variable resistance element 11 may be reversed. A leakage current flowing in a non-selection variable resistance memory cell in a program or read operation may be blocked by the bidirectional diode 14. The variable resistance element 11 of FIG. 13D may autonomously exhibit the self-compliance current-voltage characteristic as shown in FIG. 3A.

Figure 3E:
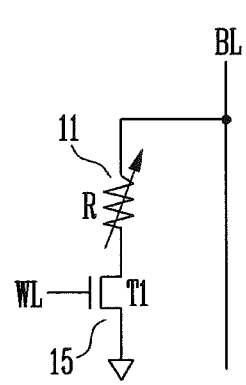

Referring to FIG. 3E, the variable resistance memory cell includes a variable resistance 11 and a first transistor T1 15. The first transistor 15 is a selection element (or switching element) that supplies or blocks a current to the variable resistance element 11 according to a voltage of a word line WL. The first transistor 15 may be coupled between the variable resistance element 11 and a ground node, and be controlled by the voltage of the word line WL. The variable resistance element 11 may be coupled between a bit line BL and the first transistor 15. The positions of the first transistor 15 and the variable resistance element 11 may be reversed. The variable resistance element 11 of FIG. 3E may not autonomously exhibit the self-compliance current-voltage characteristic. However, the variable resistance memory cell of FIG. 3E may exhibit the self-compliance current-voltage characteristic due to a self-characteristic of the first transistor 15 or by controlling the voltage of the word line LW coupled to a gate of the first transistor 15. This will be described in detail below.

Figure 3F:
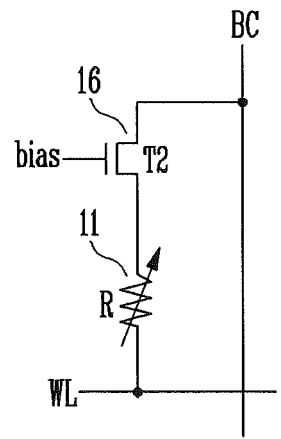

Referring to FIG. 3F, the variable resistance memory cell includes a variable resistance element 11 and a second transistor T2 16. The second transistor 16 may be coupled between the variable resistance element 11 and a bit line BL, and be controlled by a bias voltage. The variable resistance element 11 may be coupled between a word line WL and the second transistor 16. The positions of the second transistor 16 and the variable resistance element 11 may be reversed. The variable resistance element 11 of FIG. 3F may not autonomously exhibit the self-compliance current-voltage characteristic. However, the variable resistance memory cell of FIG. 3F may exhibit the self-compliance current-voltage characteristic due to a self-characteristic of the second transistor 16 or by controlling the bias voltage for controlling a gate of the second transistor 16.

Figure 4:
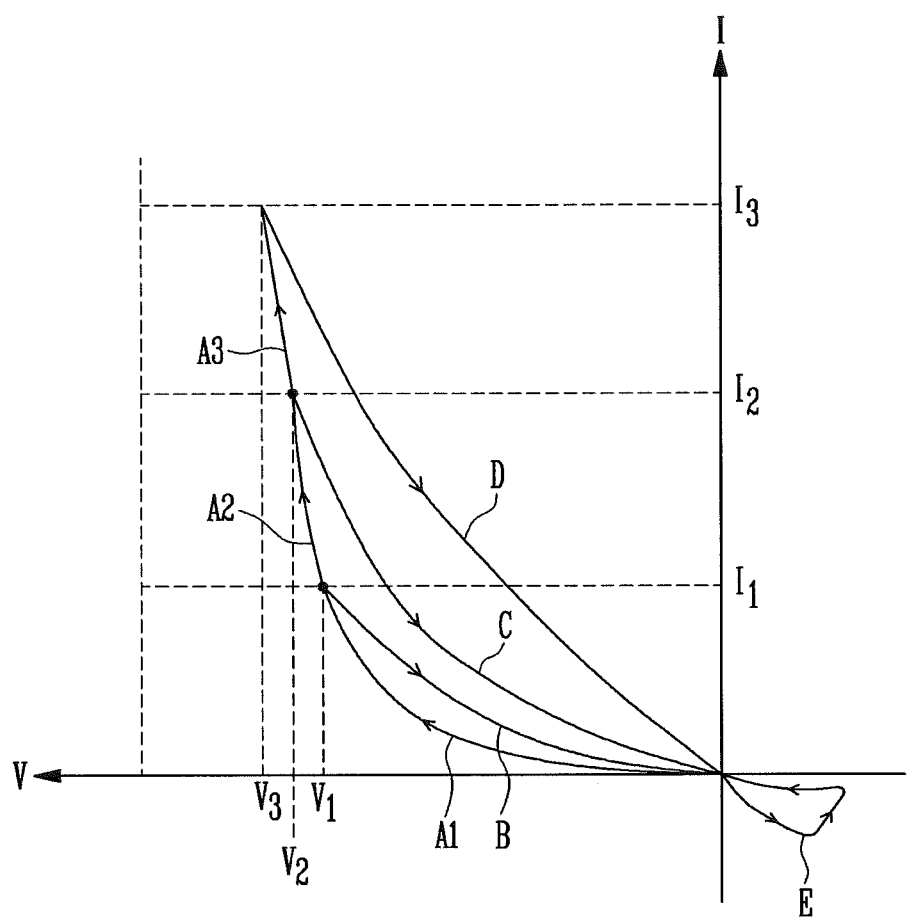
FIG. 4 is a view illustrating hysteresis characteristics of the variable resistance memory cell.

FIG. 4 is a view illustrating hysteresis characteristics of the variable resistance memory cell.

Referring to FIG. 4, the variable resistance memory cell exhibits different hysteresis characteristics depending on magnitudes of a set voltage. The hysteresis characteristics will be described with reference to a current-voltage section in which the resistance of the variable resistance memory cell is changed to a set state, i.e., a low-resistance state.

If a sequentially increased voltage V is applied between both ends of the variable resistance memory cell, the variable resistance memory cell may be programmed to a set state that is a low-resistance state. Then, if the voltage applied between both the ends of the variable resistance memory cell that exists in the set state is sequentially decreased, a current-voltage curve is illustrated as another curve different from that when the voltage is increased. Such a characteristic is referred to as a hysteresis characteristic.

First, when the voltage applied between both the ends of the variable resistance memory cell is increased in a first compliance current $I_1$ state, the current-voltage curve of the variable resistance memory cell may exhibit a hysteresis characteristic such as 'A1.' In this case, if the voltage applied between both the ends of the variable resistance memory cell reaches a first set voltage $V_1$, the variable resistance memory cell is in the set state, and therefore, the resistance value of the variable resistance memory cell may become small. After, the voltage applied between both the ends of the variable resistance memory cell is decreased, the current-voltage curve of the variable resistance memory cell may exhibit a hysteresis characteristic such as 'B.' Such a state of the variable resistance memory cell may be referred to as a first set state.

When the voltage applied between both the ends of the variable resistance memory cell is increased in a second compliance current $I_2$ state, the current-voltage curve of the variable resistance memory cell may exhibit a hysteresis characteristic such as 'A1/A2.' In this case, if the voltage applied between both the ends of the variable resistance memory cell reaches a second set voltage $V_2$ higher than the first set voltage $V_1$, the variable resistance memory cell is in the set state, and therefore, the resistance value of the variable resistance memory cell may become smaller than that in the first compliance current $I_1$ state. After this, if the voltage applied between both the ends of the variable resistance memory cell is decreased, the current-voltage curve of the variable resistance memory cell may exhibit a hysteresis characteristic such as 'C.' Such a state of the variable resistance memory cell may be referred to as a second set state.

When the voltage applied between both the ends of the variable resistance memory cell is increased in a third compliance current $I_3$ state, the current-voltage curve of the variable resistance memory cell may exhibit a hysteresis characteristic such as 'A1/A2/A3.' In this case, if the voltage applied between both the ends of the variable resistance memory cell reaches a third set voltage $V_3$ higher than the second set voltage $V_2$, the resistance value of the variable resistance memory cell may become smaller than that in the second compliance current $I_2$ state. After this, if the voltage applied between both the ends of the variable resistance memory cell is decreased, the current-voltage curve of the variable resistance memory cell may exhibit a hysteresis characteristic such as 'D.' Such a state of the variable resistance memory cell may be referred to as a third set state.

Consequently, the variable resistance memory cell can be programmed to set states having a plurality of different resistance values depending on applied voltages or compliance currents. By using such a characteristic, multi-bit data of two bits or more can be stored in one variable resistance memory cell, and the storage capacity of a variable resistance memory device including the variable resistance memory cell can be increased. When multi-bit data is stored in one variable resistance memory cell, it is possible to more easily control a set operation such that the variable resistance memory cell has a target resistance state as the interval between V1 to V3 becomes larger. In other words, as the interval between V1 to V3 becomes larger, one variable resistance memory cell can store data having a larger number of bits.

Figure 5:
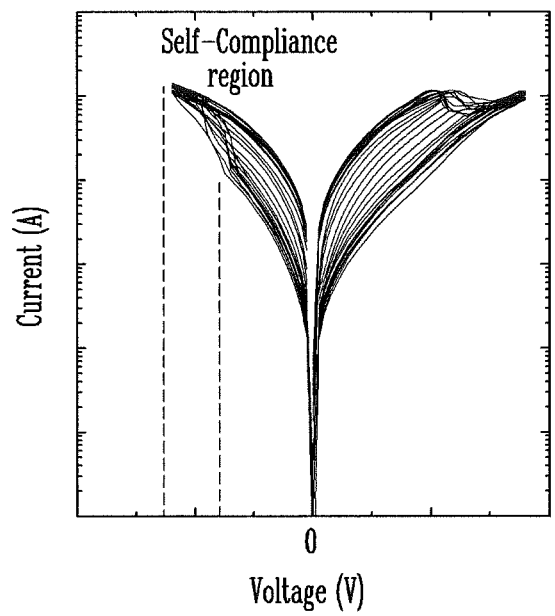
FIG. 5 is a view illustrating a self-compliance characteristic of the variable resistance memory cell according to the present disclosure.

FIG. 5 is a view illustrating a self-compliance characteristic of the variable resistance memory cell according to the present disclosure.

Referring to FIG. 5, the variable resistance memory cell may be divided into a set operation region and a reset operation region. A set operation is referred to as an operation in which the variable resistance memory cell is programmed from a high-resistance state to a low-resistance state, and a reset operation is referred to as an operation in which the variable resistance memory cell is programmed from a low-resistance state to a high-resistance state. Current-voltage curves of the set operation region and the reset operation region may have a symmetric shape, but have an asymmetric shape as shown in FIG. 5.

The variable resistance memory cell may be programmed to a plurality of set states having different resistance values so as to store multi-bit data. In other words, the variable resistance memory cell may be programmed to one reset state that is a high-resistance state and any one of set states having a plurality of different resistance values. For example, when one variable resistance memory cell stores data of two bits, a reset state, a first set state, a second set state, and a third set state may be set to '11,' '10,' '00,' and '01,' respectively. The reset state and the first to third set states are to have different resistance values that can be distinguished from one another through a read operation. One variable resistance memory cell is to have a larger number of set states so as to store data having a larger number of bits.

On the contrary, the variable resistance memory cell may have a plurality of reset states so as to store multi-bit data. In other words, the variable resistance memory cell may be programmed to one set state that is a low-resistance state and a plurality of reset states having different resistance values.

Referring to FIG. 5, the variable resistance memory cell exhibits a self-compliance characteristic in a second region included in the set operation region. The self-compliance characteristic may be a self-characteristic of the variable resistance element 11 of each of the variable resistance memory cells of FIGS. 3A to 3F. The self-compliance characteristic of the variable resistance element 11 may be a characteristic determined by the material or thickness of the data storage layer 20 described with reference to FIGS. 1 and 2A to 2D. The self-compliance characteristic may be a characteristic caused by coupling of the variable resistance element 11 and the resistance element 12 in the variable resistance memory cell of FIG. 3B. Also, the self-compliance characteristic may be a characteristic caused by coupling of the variable resistance element 11 and the transistor 15 or 16 in each of the variable resistance memory cells of FIGS. 3E and 3F. In the variable resistance memory cell of FIG. 3E, the voltage of the word line WL may be controlled such that the self-compliance characteristic shown in FIG. 5 is exhibited in the set operation. Also, in the variable resistance memory cell of FIG. 3F, the bias voltage may be controlled such that the self-compliance characteristic shown in FIG. 5 is exhibited in the set operation.

When the variable resistance memory cell does not exhibit the self-compliance characteristic shown in the second region of FIG. 5, the variable resistance layer 201 may be damaged by a transient current generated when the set operation in which the resistance of the variable resistance memory cell is changed from a high-resistance state to a low-resistance state is performed by applying a typical voltage pulse, and therefore, the reset operation may not be performed in a voltage region having the opposite polarity. As a result, the variable resistance memory cell may not normally store data. When the variable resistance memory cell exhibits the self-compliance characteristic shown in FIG. 5, any transient current is not generated without any separate current limitation when a voltage pulse is applied in the set operation, and thus the reset operation can be performed in a voltage region having the opposite polarity. As a result, data can be stably stored even when a plurality of reset-set cycles are repeated.

A gradual slope characteristic of a current-voltage curve of the second region that exhibits the self-compliance characteristic may be effectively controlled when one variable resistance memory cell is programmed to any one of the plurality of set states. In other words, a set operation in which the resistance of the variable resistance memory cell is changed from a high-resistance state to a low-resistance state is performed in the second region, and it is difficult to control the variable resistance memory cell to be efficiently programmed to a target resistance value of the set state when the current-voltage curve of the second region is steep. This will be described in detail below.

Unlike the example of FIG. 5, the self-compliance characteristic of the variable resistance memory cell may be exhibited in the reset operation region. In this case, when the variable resistance memory cell stores multi-bit data as described above, the variable resistance memory cell may be programmed to any one of the plurality of reset states, using a self-compliance region of the reset operation region.

Figure 6A:
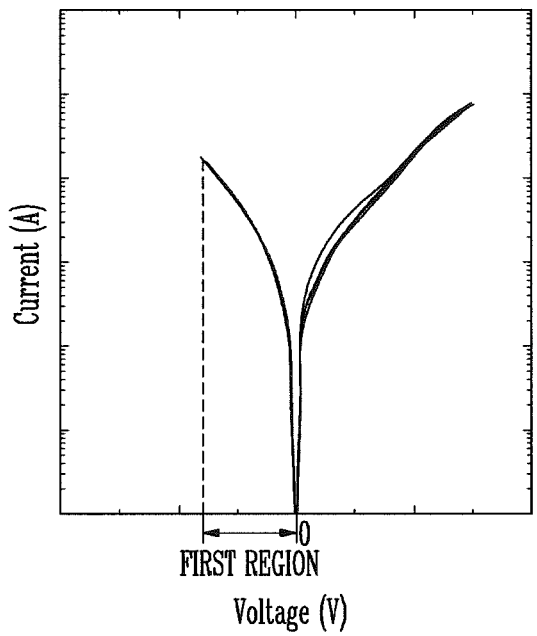
FIGS. 6A and 6B are views illustrating a program operation using the self-compliance characteristic of the variable resistance memory cell according to the present disclosure.
Figure 6B:
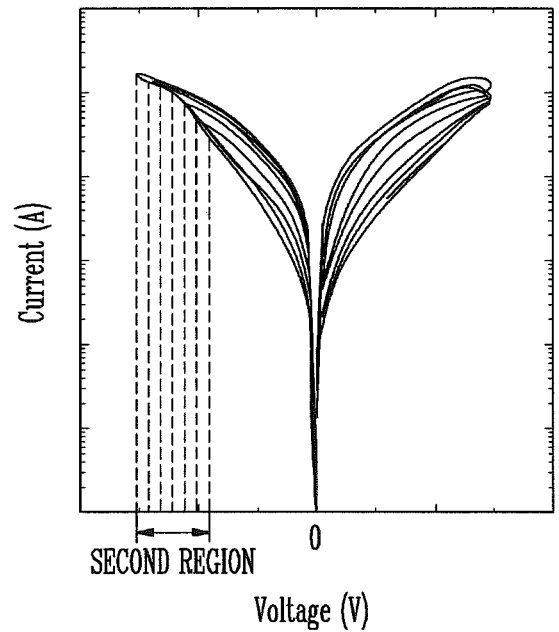

FIGS. 6A and 6B are views illustrating a program operation using the self-compliance characteristic of the variable resistance memory cell according to the present disclosure.

Referring to FIG. 6A, it can be seen that, when a set voltage pulse of a first region is applied in a set program operation of the variable resistance memory cell, the variable resistance memory cell does not exhibit a hysteresis characteristic that can be distinguished. In other words, when the set program operation is performed using the set voltage pulse of the first region, it may be difficult to read data programmed through a read operation without any error.

Referring to FIG. 6B, when a set voltage pulse included in a second region, i.e., a self-compliance region is applied in the set program operation of the variable resistance memory cell, the variable resistance memory cell may exhibit a hysteresis characteristic that can be distinguished. In addition, the variable resistance memory cell may have different hysteresis characteristics with respect to the set voltage pulse having various levels depending on a gradual current-voltage curve characteristic of the self-compliance region. In other words, the variable resistance memory cell may have various resistance values by varying the set voltage pulse when the set program operation is performed using the gradual current-voltage curve characteristic of the self-compliance region of the variable resistance memory cell. Accordingly, the variable resistance memory cell can store multi-bit data. When a plurality of set states having different resistance values are formed using set voltage pulses having various magnitudes, which are included in the self-compliance region, a difference in read current that can be distinguished may be generated by applying a read voltage between the plurality of set states. Such an excellent multi-bit data storage characteristic is reinforced by the gradual current-voltage curve characteristic of the self-compliance region of the variable resistance memory cell. In other words, since the current-voltage curve characteristic of the self-compliance region is gradual, the voltage range of the second region is widened, and consequently, it is possible to more easily generate set voltage pulses having various magnitudes, which generate a plurality of set states. As the current-voltage curve of the self-compliance region becomes more gradual, the set operation for storing multi-bit data in the variable resistance memory cell is more easily controlled, and consequently, data of a larger number of bits can be stored in one variable resistance memory cell.

As described above, the gradual current-voltage curve characteristic of the self-compliance region of FIG. 6B may be a self-characteristic of the variable resistance element 11 as described with reference to FIGS. 3A to 3F, and be a characteristic caused by coupling of the variable resistance element 11 and the resistance element 12 or the transistor 15 or 16. The slope of the current-voltage curve of the self-compliance region may be varied depending on the resistance value of the resistance element 12. Also, the slope of the current-voltage curve of the self-compliance region may be determined according to the voltage of the word line WL for controlling the first transistor 15 or the self-characteristic of the first transistor 15 as described in FIG. 3E. The slope of the current-voltage curve of the self-compliance region may be determined according to the bias voltage for controlling the second transistor 16 or the self-characteristic of the second transistor 16 as described in FIG. 3F.

When multi-bit data is programmed using the set operation as described in FIG. 6B, a set voltage, i.e., a program voltage and a read voltage may have phases opposite to each other. However, the present disclosure is not limited thereto, and the set voltage and the read voltage may have the same phase. Also, when multi-bit data is programmed using the reset operation as described above, a reset voltage, i.e., a program voltage and a read voltage may have the same phase. However, the present disclosure is not limited thereto, and the reset voltage and the read voltage may have phases opposite to each other. Consequently, when a program operation for storing multi-bit data in the variable resistance memory cell is performed, a voltage of a program pulse and a read voltage may have phases opposite to each other or have the same phase.

Figure 7A:
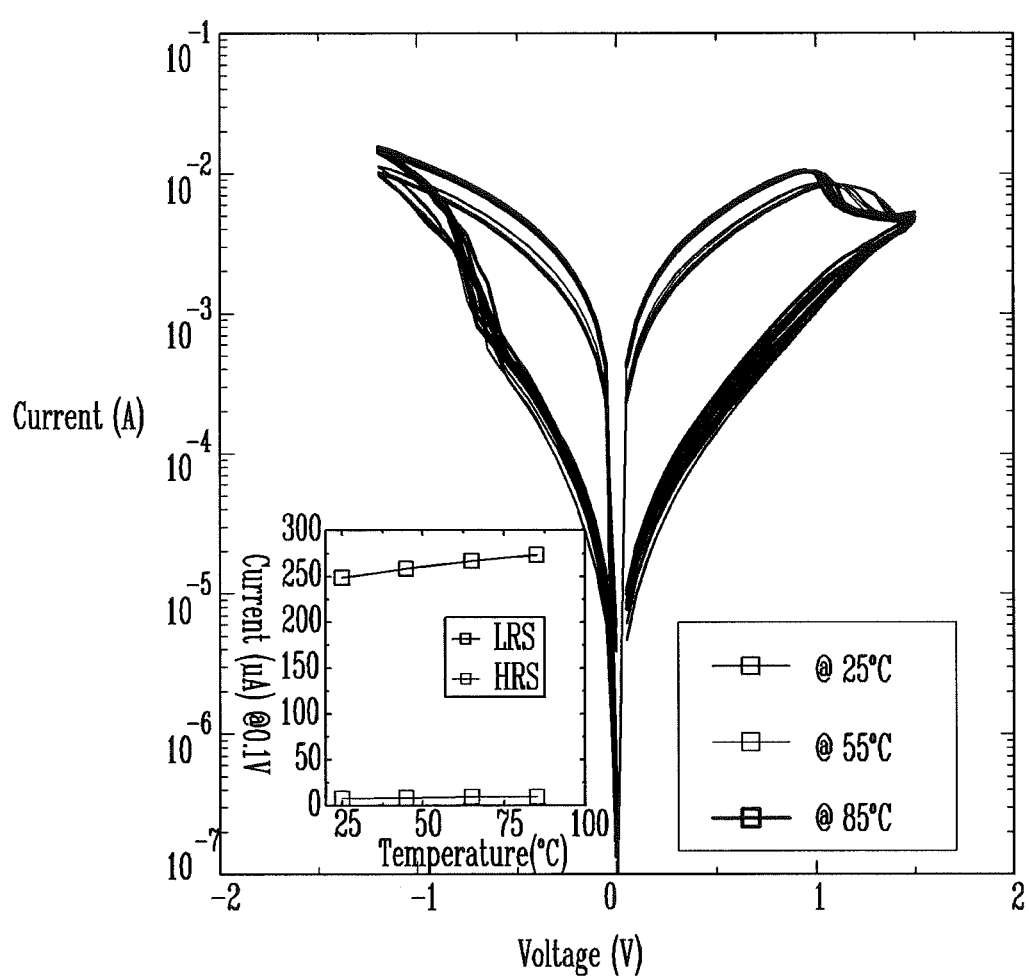
FIGS. 7A to 7C illustrate current-voltage curves in a set operation and a reset operation of the variable resistance memory cell according to the present disclosure.
Figure 7B:
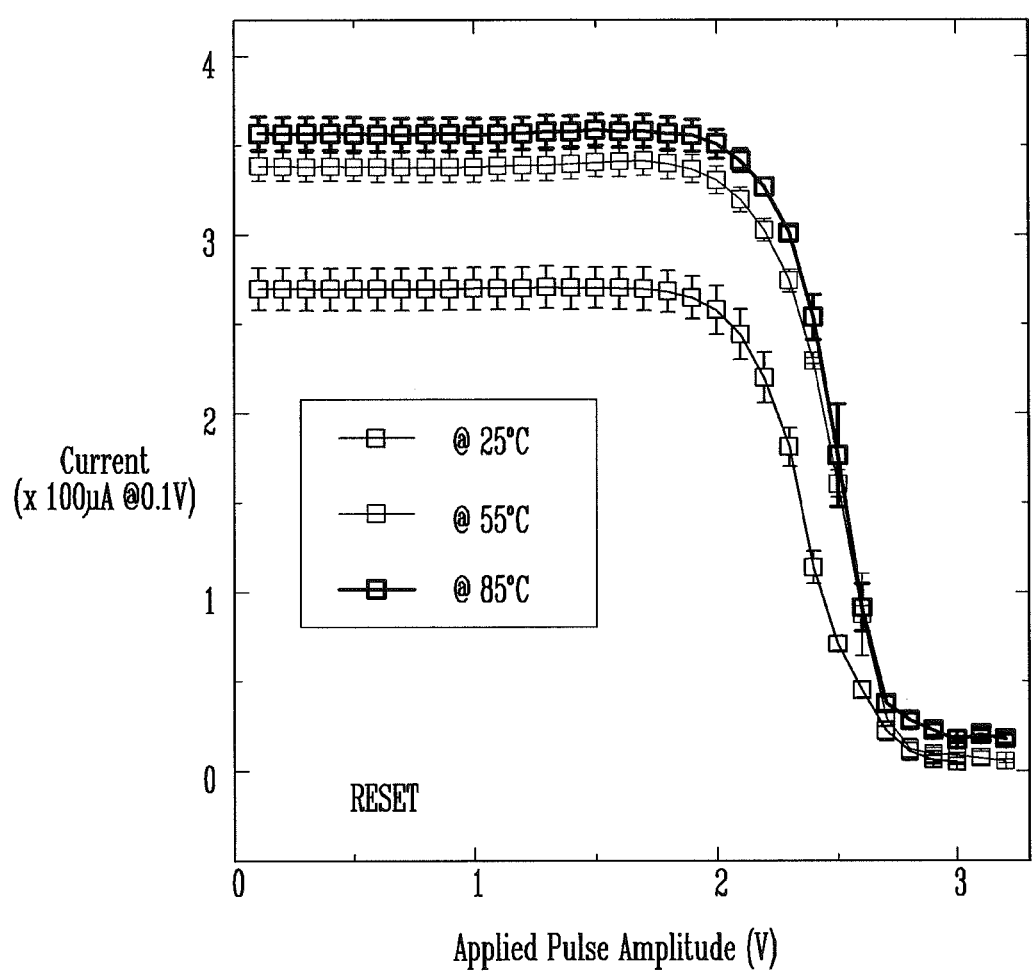
Figure 7C:
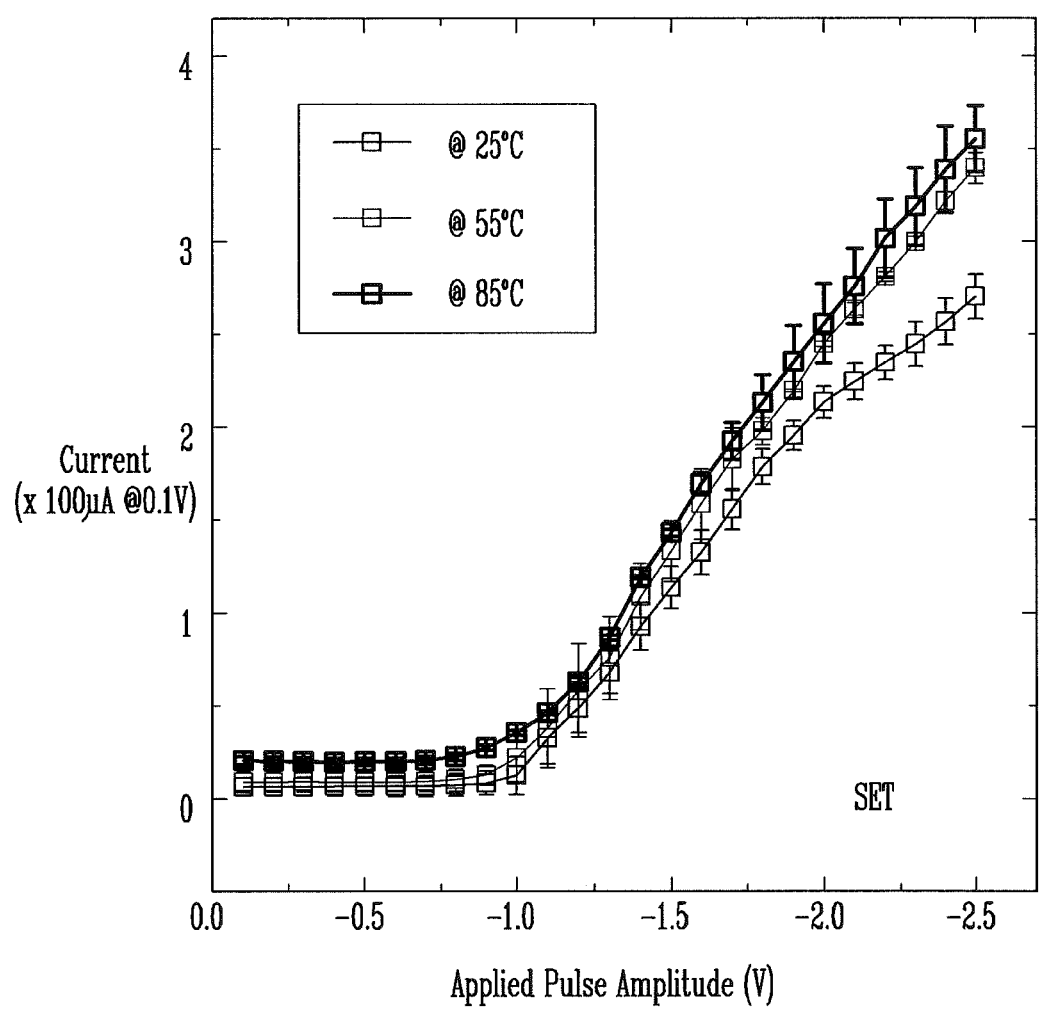

FIGS. 7A to 7C illustrate current-voltage curves in the set operation and the reset operation of the variable resistance memory cell according to the present disclosure.

Referring to FIG. 7A, the variable resistance memory cell may exhibit a self-compliance characteristic in a set voltage region as described above. When the variable resistance memory cell does not exhibit the self-compliance characteristic as shown in FIG. 7A, the variable resistance layer 201 may be damaged by a transient current generated when the set operation in which the resistance of the variable resistance memory cell is changed from a high-resistance state to a low-resistance state is performed by applying a typical voltage pulse, and therefore, the reset operation may not be performed in a voltage region having the opposite polarity. In other words, when the variable resistance memory cell exhibits the self-compliance characteristic shown in FIG. 5, any transient current is not generated without any separate current limitation when a voltage pulse is applied in the set operation, and thus the reset operation can be performed in a voltage region having the opposite polarity.

On the other hand, the self-compliance characteristic shown in the set voltage region may not be exhibited in a reset voltage region. In this case, it may be advantageous to store multi-bit data by forming a plurality of set states, using the set operation as a program operation.

FIG. 7B illustrates that the resistance of the variable resistance memory cell increases as a reset voltage pulse is applied, and a read current is measured with respect to a resistance changed by each reset voltage pulse. The read current measured when a voltage of 0.1 V is applied between both ends of the variable resistance memory device is exemplified. Referring to FIG. 7B, there is illustrated a reset characteristic of the variable resistance memory cell having the current-voltage curve characteristic shown in FIG. 7A. If a gradually increased reset voltage is applied to the variable resistance memory cell, the resistance of the variable resistance memory cell is changed from a low-resistance state to a high-resistance state at any moment. At this time, it can be seen that the slope of the current-voltage curve is considerably steep. Due to the characteristic of such a steep current-voltage curve, it may be difficult to store multi-bit data in the reset operation. This is because it may be difficult to precisely control the level of a reset voltage that allows the resistance of the variable resistance memory cell to be reset to a target resistance value. In addition, it can be seen from FIG. 7B that a slightly large difference occurs in the reset characteristic depending on a change in temperature.

FIG. 7C illustrates that the resistance of the variable resistance memory cell decreases as a set voltage pulse is applied, and a read current is measured with respect to a resistance changed by each set voltage pulse. The read current measured when a voltage of 0.1 V is applied between both ends of the variable resistance memory device is exemplified. Referring to FIG. 7C, there is illustrated a reset characteristic of the variable resistance memory cell having the current-voltage curve characteristic shown in FIG. 7A. If an applied voltage is gradually increased, the resistance of the variable resistance memory cell is changed from a high-resistance state to a low-resistance state at any moment. At this time, it can be seen that the slope of the current-voltage curve is considerably gradual as compared with the reset characteristic. The characteristic of such a gradual current-voltage curve has something in common with the gradual current-voltage curve characteristic of the self-compliance region of FIG. 7A, and multi-bit data can be stably stored in the set operation due to the characteristic of the gradual current-voltage curve. In other words, as the set voltage region in which the resistance of the variable resistance memory cell is changed from a high-resistance state to a low-resistance state is widely distributed, it is possible to more easily control a set voltage generating and applying operation that allows the variable resistance memory cell to be in a target resistance state. In addition, it can be seen that a difference smaller than that of the reset characteristic occurs in the set characteristic depending on a change in temperature. Such a temperature characteristic may be a factor that allows a program characteristic caused by the set operation to be further excellent.

Figure 8:
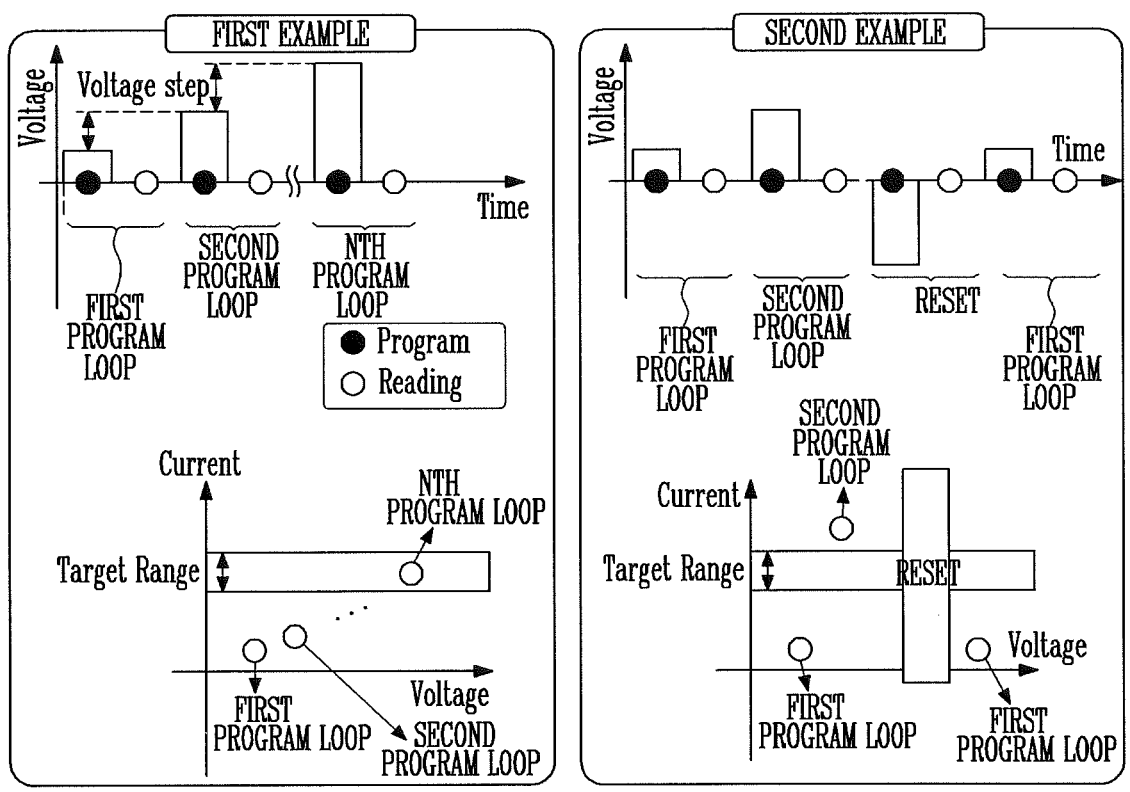
FIG. 8 is a view illustrating a sequence of the program operation using the self-compliance characteristic of the variable resistance memory cell according to the present disclosure.

FIG. 8 is a view illustrating a sequence of the program operation using the self-compliance characteristic of the variable resistance memory cell according to the present disclosure.

Referring to FIG. 8, the program operation of the variable resistance memory cell may be performed using a sequentially increased voltage pulse. Such a method may be referred to as an Incremental Step Pulse Program (ISPP) method. At this time, the program operation may be a set operation or a reset operation. When the self-compliance characteristic is exhibited in the set operation region as described above, an ISPP operation for storing multi-bit data is to be the set operation. On the contrary, when the self-compliance characteristic is exhibited in the reset operation region, an ISPP operation for storing multi-bit data is to be the reset operation. Hereinafter, a case where the program operation is the set operation will be described in detail.

In FIG. 8, solid circle symbol '●' represents an operation of applying a program voltage pulse, and blank circle symbol 'o' represents a verify read operation. First, the resistance of the variable resistance memory cell is changed from a high-resistance state to a low-resistance state through a set program operation. At this time, when a read current flowing through the variable resistance memory cell has a resistance value that is larger than the minimum current limit value and is smaller than the maximum current limit value in a verify read operation of the variable resistance memory cell, the set program operation passes. In other words, a distribution of a set state may be gathered in a region in which the magnitude of the read current is larger than the minimum current limit value and is smaller than the maximum current limit value through the set program operation. At this time, the region between the minimum current limit value and the maximum current limit value may be referred to as a distribution of a set state. As the region between the minimum current limit value and the maximum current limit value becomes smaller, the distribution of the set state may be formed wider. In addition, the probability that distributions between adjacent set states will not overlap with each other may increase as the region between the minimum current limit value and the maximum current limit value becomes smaller, and the probability that a read operation will succeed may increase as a read margin increases. However, as the region between the minimum current limit value and the maximum current limit value becomes smaller, a program time increases, and therefore, program performance may be deteriorated. On the contrary, the probability that distributions between adjacent set states will not overlap with each other may decrease as the region between the minimum current limit value and the maximum current limit value becomes larger, and the probability that the read operation will succeed may decrease as the read margin decreases. However, as the region between the minimum current limit value and the maximum current limit value becomes larger, the program time decreases, and thus the program performance can be improved. Accordingly, the region between the minimum current limit value and the maximum current limit value is to be optimally set by considering the program performance and the reliability of the read operation.

The set program operation of the variable resistance memory cell may include a plurality of program loops, and each of the program loops may be configured with a set voltage pulse apply operation and a verify read operation. A set voltage pulse may be sequentially increased while a plurality of program loops are being performed. The verify read operation may be determined as program pass when the read current of the variable resistance memory cell exists in a region between the minimum current limit value and the maximum current limit value.

First Example illustrates an embodiment of the case where the program operation is the set operation. The variable resistance memory cell may gradually come close to a target read current region due to the sequentially increased set voltage pulse. Also, it is determined whether the variable resistance memory cell has entered into the target read current range through a verify read operation performed after each set voltage pulse is applied. If it is determined that the read current of the variable resistance memory cell is smaller than the minimum current limit value through the verify read operation, a next program loop may be performed. The next program loop may use a set voltage pulse larger than that in a previous program loop. First Example is a case where the read current of the variable resistance memory cell reaches a target range in an Nth program loop. In this case, the program operation may be ended after N program loops are performed. The read current of the variable resistance memory cell can more accurately reach the target range when the increment of the program voltage pulse according to the program loops is to be set smaller as the region between the minimum current limit value and the maximum current limit value becomes smaller.

As the program loops are performed, the voltage step of the set voltage pulse may be constant, or be gradually increased or decreased. Also, the voltage step of the set voltage pulse may be determined based on the slope of the current-voltage curve of the self-compliance region.

The magnitude of the set voltage pulse in a first program loop may be varied depending on a target set state. For example, when a resistance value of a first set state is larger than that of a second set state, the magnitude of the set voltage pulse in the first program loop when the variable resistance memory cell is programmed to the first set state may be smaller than that of the set voltage pulse in the first program loop when the variable resistance memory cell is programmed to the second set state.

Second Example illustrates a case where the program operation, i.e., the set operation is re-performed after a reset operation is performed on the variable resistance memory cell of which program operation has passed through First Example. The variable resistance memory cell may show another aspect different from that in First Example with respect to the same set voltage pulse. In other words, as compared with the resistance value that the variable resistance memory cell reaches in a second program loop in First Example, the variable resistance memory cell may reach another resistance value in the same program loop in Second Example. Second Example shows a case where the variable resistance memory cell exceeds the maximum current limit value in the second program loop. When it is determined the current of the variable resistance memory cell has exceeded the maximum current limit value in a verify read operation of the second program loop, a next program loop is not performed, but the resistance of the variable resistance memory cell is changed to a high-resistance state through the reset operation. In addition, after the reset operation, the program operation, i.e., the program loop for the set operation may be re-started.

When the variable resistance memory cell stores multi-bit data, a plurality of set states exist. At this time, the minimum current limit values and the maximum current limit values of the set states are set different from one another. For example, when the first set state and the second set state are adjacent to each other, and the resistance value of the first set state is larger than that of the second set state, the maximum current limit value of the first set state may be smaller than the minimum current limit value of the second set state. In addition, as the interval between the maximum current limit value of the first set state and the minimum current limit value of the second set state becomes wider, a larger read margin can be secured in the read operation, and consequently, the reliability of the read operation can be improved.

When the variable resistance memory cell stores multi-bit data, the maximum current limit value of a set state having the smallest resistance value among a plurality of set states may be set to 100 μA or less. This may be implemented as the self-compliance region of the variable resistance memory cell according to the present disclosure is designed such that the read current of the set state having the smallest resistance value as described above is 100 μA or less. The magnitude of the maximum read current is limited under the control of the self-compliance region, which is very important in realizing the low power of a memory device. As an example, the self-compliance region of the variable resistance memory cell is implemented such that the read current of the set state having the smallest resistance value is 100 μA or less. This may be implemented by controlling the material or thickness of the data storage layer 20, the variable resistance layer 201, the insulating layer 202, the oxygen exchange layer 203 or the additional insulating layer 204, which is described with reference to FIG. 1 or 2A to 2D.

As described above, the variable resistance memory cell may have a random characteristic in which the resistance of the variable resistance memory cell is set to different resistance values with respect to the same set voltage pulse during a plurality of reset-set cycles. The random characteristic may be a unique characteristic of the variable resistance memory cell. Consequently, due to the random characteristic, it is necessary to control the program operation, based on both of the minimum current limit value and the maximum current limit value, so as to control the set distribution of the variable resistance memory cell. As a result, a precise program sequence is required as described above.

Figure 9:
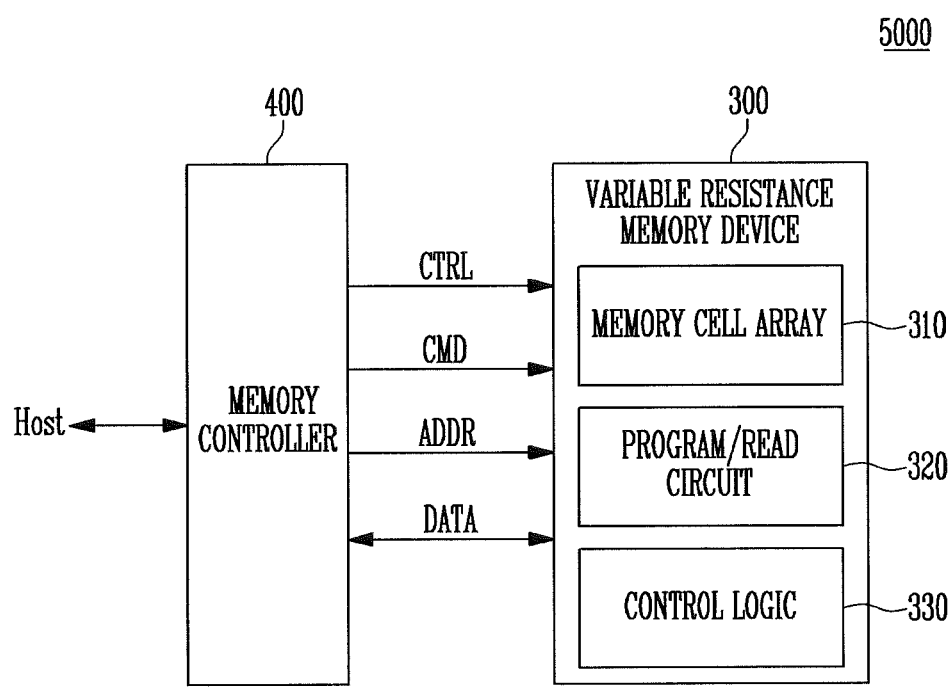
FIG. 9 is a block diagram schematically illustrating a memory system including a variable resistance memory device according to the present disclosure.

FIG. 9 is a block diagram schematically illustrating a memory system including a variable resistance memory device according to the present disclosure.

Referring to FIG. 9, the memory system 5000 may include a variable resistance memory device 300 and a memory controller 400. The variable resistance memory device 300 may include a memory cell array 310, a program/read circuit 320, and a control logic 330. Also, the variable resistance memory device 300 may further include circuits for performing set, reset, and read operations on the memory cell array 310 under the control of the control logic 330.

The memory controller 400 may control the variable resistance memory device 300 such that data stored in the variable resistance memory device 300 is read or such that data is programmed in the variable resistance memory device 300, in response to a program or read request from a host Host. Specifically, the memory controller 400 may provide an address ADDR, a command CMD, and a control signal CTRL to the variable resistance memory device 300, to control program and read operations on the variable resistance memory device 300. The program operation may include a set operation and a reset operation. The set operation may be referred to as a set program operation, and the reset operation may be referred to as a reset program operation. In addition, data DATA to be programmed and data DATA output through the read operation may be communicated between the memory controller 400 and the variable resistance memory device 300.

Although not shown in the drawing, the memory controller 400 may include a RAM, a processing unit, a host interface, and a memory interface. The RAM may be used as a working memory of the processing unit. The processing unit may control an operation of the memory controller 400. The host interface may include a protocol for performing data exchange between the host Host and the memory controller 400. For example, the memory controller 400 may be configured to communicate with the external host Host through at least one of various interface protocols such as USB, MMC, PCI-E, Advanced Technology Attachment (ATA), Serial-ATA (SATA), Parallel-ATA (PATA), SCSI, ESDI, and Integrated Drive Electronics (IDE).

The memory cell array 310 may include a plurality of variable resistance memory cells (not shown) respectively disposed in regions in which a plurality of first signal lines and a plurality of second signal lines intersect each other. In an embodiment, the plurality of first signal lines may be a plurality of bit lines, and the plurality of second signal lines may be a plurality of word lines. In another embodiment, the plurality of first signal lines may be a plurality of word lines, and the plurality of second signal lines may be a plurality of bit lines.

Each of the plurality of variable resistance memory cells may be a single level cell (SLC) for storing data of one bit or a multi-level cell (MLC) for storing data of at least two bits. When data of one bit is programmed in one variable resistance memory cell, the variable resistance memory cells may have two resistance level distributions according to the programmed data. Alternatively, when data of two bits is programmed in one variable resistance memory cell, the variable resistance memory cells may have four resistance level distributions according to the programmed data. In another embodiment, each of the plurality of variable resistance memory cells is a quadruple level cell (QLC) for storing data of four bits. When data of four bits is programmed in one variable resistance memory cell, the variable resistance memory cells may have 16 resistance level distributions according to the programmed data. At this time, the 16 resistance level distributions may have one reset state and 15 set states. As described above, a gradual current-voltage curve characteristic of the self-compliance region of the variable resistance memory cell and a sequentially increased set voltage pulse included in a voltage region having such a characteristic may be used in order for the variable resistance memory cell to have 15 set states.

In an embodiment, the memory cell array 310 may include variable resistance memory cells having a twodimensional horizontal structure. In another embodiment, the memory cell array 310 may include variable resistance memory cells stacked in a three-dimensional vertical structure.

The program/read circuit 320 performs program and read operations on variable resistance memory cells. The program operation may be a set operation or a reset operation. The program/read circuit 320 may include a program driver that is coupled to the variable resistance memory cells through a plurality of bit lines and programs data in the variable resistance memory cells, and a sense amplifier for amplifying data read from the variable resistance memory cells.

The control logic 330 may control overall operations of the variable resistance memory device 300. Also, the control logic 330 may control the program/read circuit 320 to perform memory operations such as program and read operations. As an example, the variable resistance memory device 300 may include a power generating means (not shown) for generating various program and read voltages used for the program and read operation, and the levels of a program voltage and a read voltage may be adjusted under the control of the control logic 330.

In a program operation on the variable resistance memory device 300, the resistance value of each of the variable resistance memory cells of the memory cell array 310 may be increased or decreased according to program data. For example, the variable resistance memory cells of the memory cell array 310 may have different resistance values depending on currently stored data, and the resistance value of each of the variable resistance memory cells may be increased or decreased according to data to be programmed. The program operation may be a reset operation or a set operation. In the variable resistance memory cell, while a set state may a relatively low resistance value, a reset state may have a relatively high resistance value. The reset operation is performed in the direction in which the resistance value of a variable resistor increases, and the set operation is performed in the direction in which the resistance value of the variable resistor decreases.

Meanwhile, the memory controller 400 and the variable resistance memory device 300 may be integrated as one semiconductor device. As an example, the memory controller 400 and the variable resistance memory device 300 may be integrated into one semiconductor device, to constitute a memory card. For example, the memory controller 400 and the variable resistance memory device 300 may be integrated into one semiconductor device, to constitute a memory card such as a PC card (Personal Computer Memory Card International Association (PCMCIA)), a Compact Flash (CF) card, a Smart Media Card (SM or SMC), a memory stick, a multimedia card (MMC, RS-MMC or MMCmicro), an SD card (SD, miniSD, microSD or SDHC), or a Universal Flash Storage (UFS). As another example, the memory controller 400 and the variable resistance memory device 300 may be integrated as one semiconductor device, to constitute a Solid State Disk/Drive (SSD).

A detailed operation example of the variable resistance memory device 300 included in the memory system 5000 configured as described above will be described with reference to FIG. 10.

Figure 10:
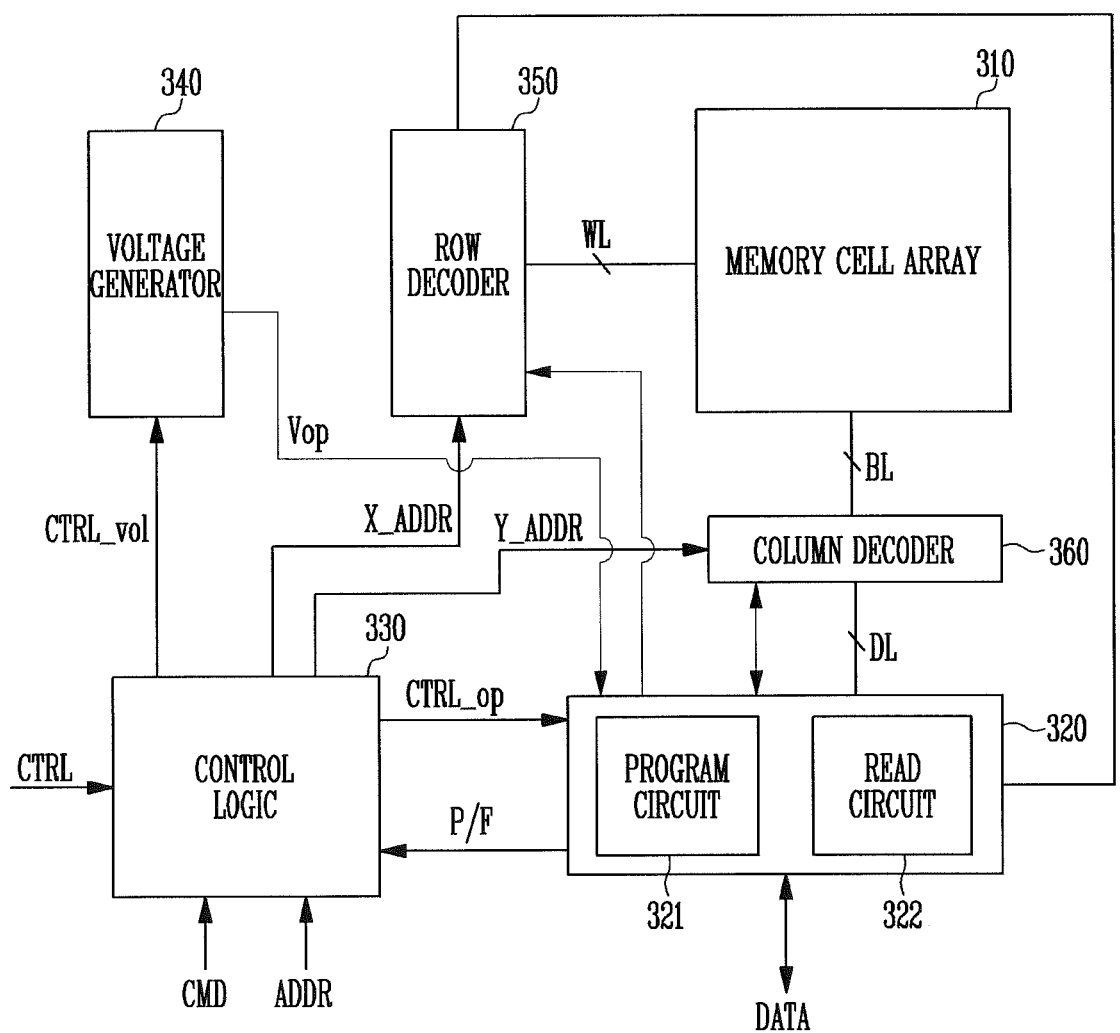
FIG. 10 is a block diagram illustrating an implementation example of the variable resistance memory device of FIG. 9 according to the present disclosure.

FIG. 10 is a block diagram illustrating an implementation example of the variable resistance memory device of FIG. 9 according to the present disclosure.

Referring to FIG. 10, the variable resistance memory device 300 may include a memory cell array 310, a program/read circuit 320, a control logic 330, and a voltage generator 340. Also, the variable resistance memory device 300 may further include a row decoder 350, and a column decoder 360. In addition, the program/read circuit 320 may include a program circuit 321 and a read circuit 322.

The memory cell array 310 may be coupled to a plurality of first signal lines and a plurality of second signal lines. Also, the memory cell array 310 may include a plurality of variable resistance memory cells respectively disposed in regions in which the plurality of first signal lines and the plurality of second signal lines intersect each other. Hereinafter, embodiments of the present disclosure will be described by exemplifying a case where the plurality of first signal lines are word lines WL and the plurality of second signal lines are bit lines BL.

An address ADDR for indicating a variable resistance memory cell to be accessed may be received together with command CMD. The address ADDR may include a row address X_ADDR for selecting word lines WL of the memory cell array 310 and a column address Y_ADDR for selecting bit lines BL of the memory cell array 310. The row decoder 350 is coupled to the memory cell array 310 through the word lines WL, and may select at least one of the word lines WL in response to the row address X_ADDR.

The column decoder 360 is coupled to the memory cell array 310 through the bit lines BL, and may select at least one of the bit lines BL in response to the column address Y_ADDR.

The program/read circuit 320 may program data DATA input from the outside in the memory cell array 310 or read data programmed in the memory cell array 310 and then output the read data to the outside, under the control of the control logic 330. Also, the program/read circuit 320 may provide a program or read result to the control logic 330. For example, in a program operation, the program/read circuit 320 may perform a verify read operation so as to detect a result of the program operation, and provide a verify read result, e.g., a program pass or program fail (P/F) signal to the control logic 330.

The program/read circuit 320 may be selectively coupled to the row decoder 350 ad the column decoder 360. Therefore, the program/read circuit 320 may be selectively coupled to a word line WL or a bit line BL to program data in the variable resistance memory cell or read data from the variable resistance memory cell and then output the read data.

The program/read circuit 320 may include the program circuit 321 and the read circuit 322. The program circuit 321 may perform a program operation by providing a program pulse to a selected variable resistance memory cell through the column decoder 360 or the row decoder 350. Accordingly, data DATA to be stored can be input to the memory cell array 310. In an embodiment, the program pulse may be a voltage pulse. In another embodiment, the program pulse may be a current pulse.

Specifically, the program circuit 321 may perform a set operation of programming the variable resistance memory cell in the direction in which the resistance of the variable resistance memory cell decreases. Also, the program circuit 321 may perform a reset operation of programming the variable resistance memory cell in the direction in which the resistance of the variable resistance memory cell increases.

The read circuit 322 is coupled to a selected bit line BL through the column decoder 360, and may perform a read operation of reading stored data by sensing a resistance level of the selected variable resistance memory cell. Specifically, when a read command is received from the memory controller (400 of FIG. 9), the read circuit 322 may perform a read operation on the variable resistance memory cell. Also, after, a program operation on the variable resistance memory cell is performed, the read circuit 322 may perform a verify read operation of determining whether the program operation on the variable resistance memory cell has completed.

In the read operation, the read circuit 322 may provide the read data DATA to the outside of the variable resistance memory device 300, e.g., the memory controller 400. Also, in the verify read operation, the read circuit 322 may provide a pass/fail signal (P/F) indicating that the program operation has passed/failed as a result of the program operation to the inside of the variable resistance memory device 300, e.g., the control logic 330 or the program circuit 321.

The read circuit 322 may generate a first current having the minimum current limit value and a second current having the maximum current limit value. Also, the read circuit 322 may determine whether the program operation has passed or failed by comparing the first current and the second current with a read current flowing through the variable resistance memory cell during the verify read operation.

When the read circuit 322 determines that the read current flowing through the variable resistance memory cell is smaller than the first current during the verify read operation, the read circuit 322 may transmit the determination result to the control logic 330. Based on the determination result, the control logic 330 may further perform a next program loop, using a large program voltage pulse. When the read circuit 322 determines that the read current flowing through the variable resistance memory cell is larger than the second current during the verify read operation, the read circuit 322 may transmit the determination result to the control logic 330. Based on the determination result, the control logic 330 may perform a reset operation on the variable resistance memory cell and then control a program operation, i.e., a set operation to be re-performed. When the read circuit 322 determines that the read current flowing through the variable resistance memory cell is smaller than the first current or is larger than the second current during the verify read operation, the read circuit 322 may output a program fail signal.

When the read circuit 322 determines that the read current flowing through the variable resistance memory cell is larger than the first current or is smaller than the second current during the verify read operation, i.e., when the read circuit 322 determines that the program operation has passed, the read circuit 322 may transmit the determination result to the control logic 330. Based on the determination result, the control logic 330 may end the program operation.

The voltage generator 340 may generate various types of voltages Vop for performing program and read operations on the memory cell array in response to a voltage control signal CTRL_vol. At this time, the program operation may include a set operation and a reset operation. The voltage generator 340 may generate voltages for driving the word lines WL and the bit lines BL, e.g., a set voltage, a reset voltage, a read voltage, and the like. As described above, the set voltage may be a sequentially increased voltage pulse, and the read voltage may have the same phase as the set voltage or have a phase opposite to that of the set voltage. In addition, the reset voltage may have a phase opposite to that of the set voltage. On the contrary, the reset voltage may be a sequentially increased voltage pulse, and the read voltage may have the same phase as the reset voltage or have a phase opposite to that of the reset voltage.

The control logic 330 may program data DATA in the memory cell array 310 or output various control signals for reading data DATA from the memory cell array 110, based on the command CMD, the address ADDR, and the control signal CTRL, which are received from the memory controller 400. The control signals output from the control logic 330 may be provided to the program/read circuit 320, the voltage generator 340, the row decoder 350, and the column decoder 360. Accordingly, the control logic 330 can control overall operations in the variable resistance memory device 300.

Specifically, the control logic 330 may generate operation control signals CTRL_op, based on the command CMD and the control signal CTRL, and provide the generated operation control signals CTRL_op to the program/read circuit 320.

Furthermore, the control logic 330 may provide the row address X_ADDR to the row decoder 350, and provide the column address Y_ADDR to the column decoder 360.

Also, the control logic 330 may generate a voltage control signal CTRL_vol, based on the command CMD, the control signal CTRL, and the pass/fail signal P/F received from the read circuit 322. The control logic 330 may provide the generated voltage control signal CTRL_vol to the voltage generator 340.

When the variable resistance memory cell does not have any self-compliance characteristic, the variable resistance memory cell may have a self-compliance characteristic under the control of the program/read circuit 320. For example, a component such as the second transistor 16 of FIG. 3F may be included in the program/read circuit 320.

Figure 11:
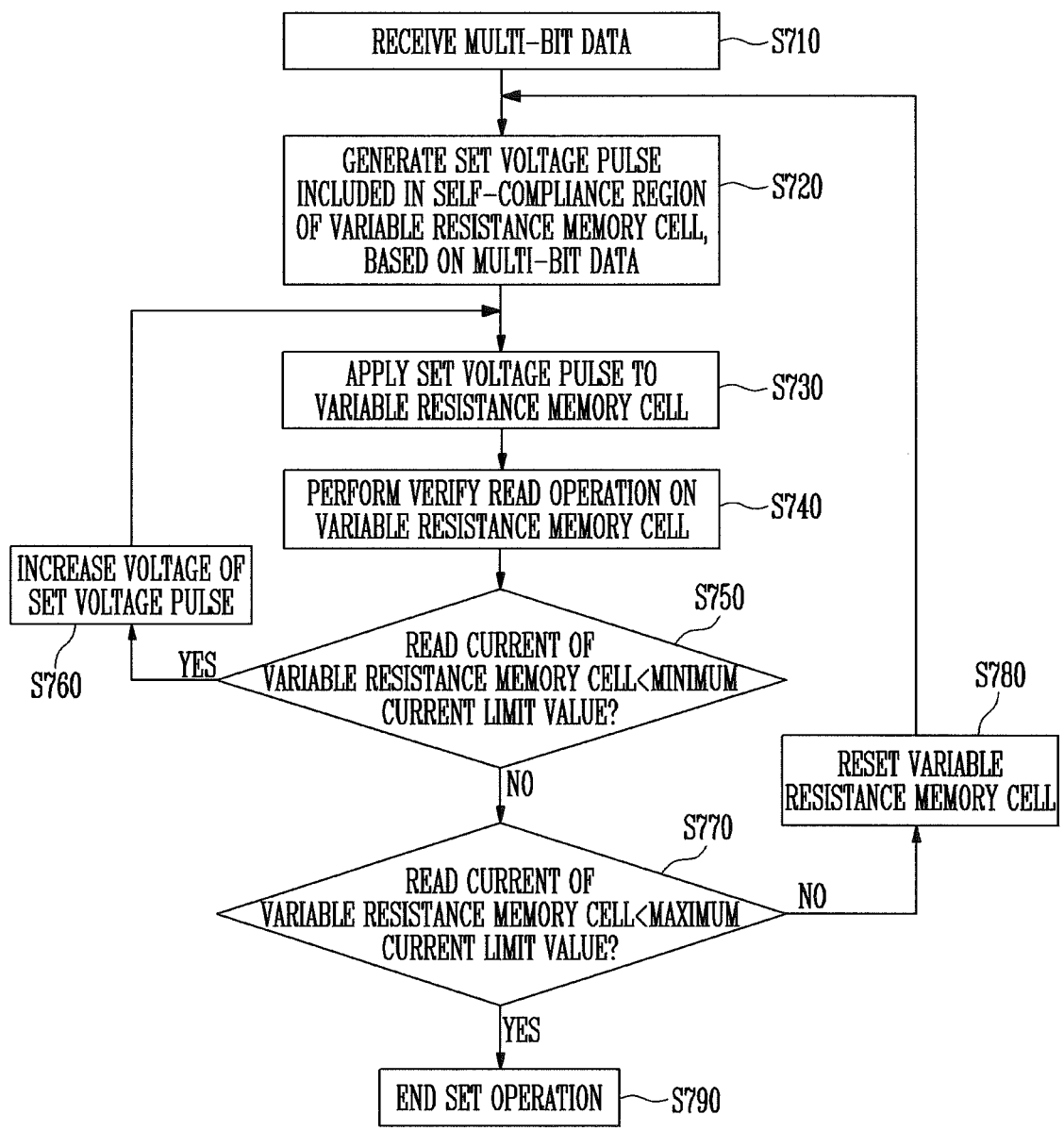
FIG. 11 is a flowchart illustrating a sequence of the set operation using the self-compliance characteristics of the variable resistance memory cell.

FIG. 11 is a flowchart illustrating a sequence of the set operation using the self-compliance characteristics of the variable resistance memory cell. FIG. 11 is an example of the case where the program operation corresponds to the set operation.

Referring to FIG. 11, first, the variable resistance memory device 300 may receive multi-bit data from the outside (step S710). Then the variable resistance memory device 300 may generate a set voltage pulse included in the self-compliance region of the variable resistance memory cell, based on the received multi-bit data (step S720). The step S720 may be performed by the voltage generator 340 of the variable resistance memory device 300. After this, the generated set voltage pulse is applied to the variable resistance memory cell (step S730). The step S730 may be performed by the program circuit 321 of the variable resistance memory device 300.

After the set voltage pulse is applied, a verify read operation may be performed on the variable resistance memory cell (step S740). Subsequently, a read current of the variable resistance memory cell may be compared with the minimum current limit value (step S750). If the read current of the variable resistance memory cell is smaller than the minimum current limit value during the verify read operation ("YES"), the voltage of the set voltage pulse may be increased and then re-applied to the variable resistance memory cell (step S760). If the read current of the variable resistance memory cell is larger than the minimum current limit value during the verify read operation ("NO"), the read current of the variable resistance memory cell may be compared with the maximum current limit value (step S770). At this time, if the read current of the variable resistance memory cell is smaller than the maximum current limit value ("YES"), it may be determined that the program operation has passed, i.e., that the set operation has passed, and the set operation may be ended (step S790). In other words, the variable resistance memory cell store multi-bit data in the form of a resistance value included in a target resistance range. At this time, if the read current of the variable resistance memory cell is larger than the maximum current limit value ("NO"), the variable resistance memory cell may be reset (step S780), and the set operation may be then re-performed from the beginning. The steps S740, S750, and S770 may be performed by the read circuit 322 of the variable resistance memory device 300.

The steps S750 and S770 may be performed in sequence or in parallel.

Figure 12:
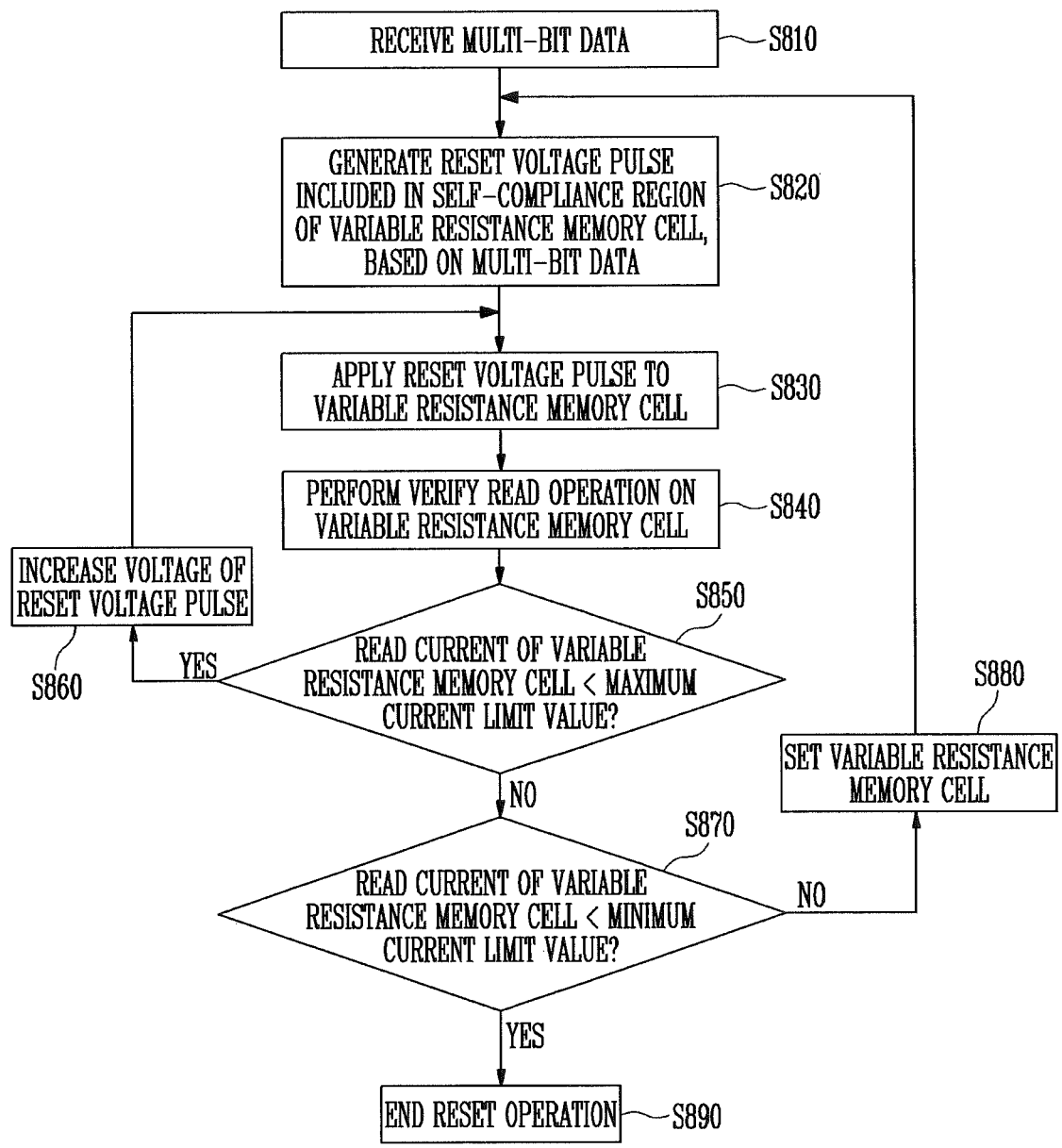
FIG. 12 is a flowchart illustrating a sequence of the reset operation using the self-compliance characteristics of the variable resistance memory cell.

FIG. 12 is a flowchart illustrating a sequence of the reset operation using the self-compliance characteristics of the variable resistance memory cell. FIG. 12 is an example of the case where the program operation corresponds to the reset operation.

Referring to FIG. 12, first, the variable resistance memory device 300 may receive multi-bit data from the outside (step S810). Then, the variable resistance memory device 300 may generate a reset voltage pulse included in the self-compliance region of the variable resistance memory cell, based on the received multi-bit data (step S820). The step S820 may be performed by the voltage generator 340 of the variable resistance memory device 300. After this, the generated reset voltage pulse is applied to the variable resistance memory cell (step S830). The step S830 may be performed by the program circuit 321 of the variable resistance memory device 300.

After the reset voltage pulse is applied, a verify read operation may be performed on the variable resistance memory cell (step S840). Subsequently, a read current of the variable resistance memory cell may be compared with the maximum current limit value (step S850). If the read current of the variable resistance memory cell is larger than the maximum current limit value during the verify read operation ("YES"), the voltage of the reset voltage pulse may be increased and then re-applied to the variable resistance memory cell (step S860). Since the reset operation is an operation in which the resistance of the variable resistance memory cell is changed from a low-resistance state to a high-resistance state, different references are applied to the reset operation as described in FIG. 11. If the read current of the variable resistance memory cell is smaller than the maximum current limit value during the verify read operation ("NO"), the read current of the variable resistance memory cell may be compared with the minimum current limit value (step S870). At this time, if the read current of the variable resistance memory cell is larger than the minimum current limit value ("YES"), it may be determined that the program operation has passes, i.e., that the reset operation has passed, and the reset operation may be ended (step S890). At this time, if the read current of the variable resistance memory cell is smaller than the minimum current limit value ("NO"), the variable resistance memory cell may be set (step S880), and the reset operation may be then re-performed from the beginning. The steps S840, S850, and S870 may be performed by the read circuit 322 of the variable resistance memory device 300.

The steps S850 and S870 may be performed in sequence or in parallel.

Figure 13:
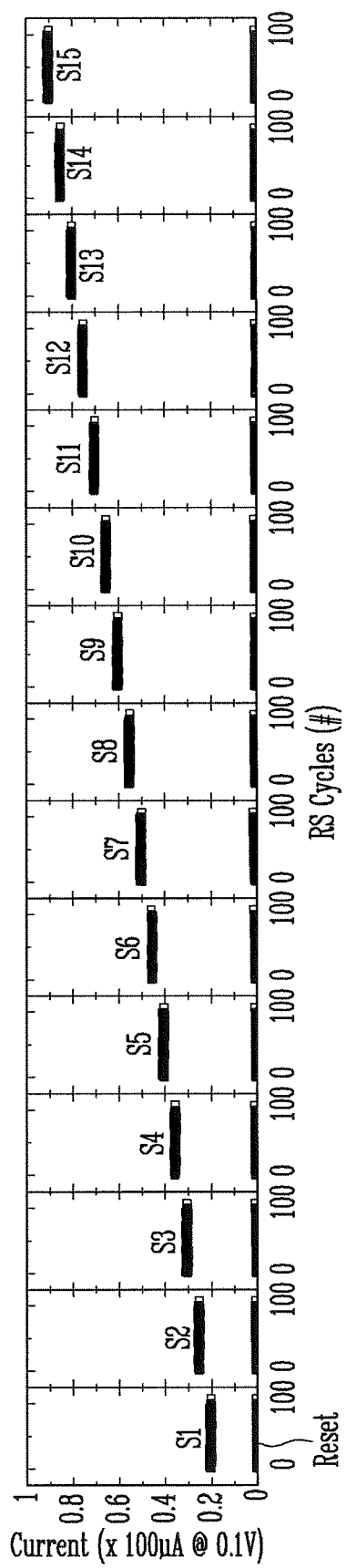
FIGS. 13 and 14 are views illustrating a program distribution of the variable resistance memory cell according to the present disclosure.
Figure 14:
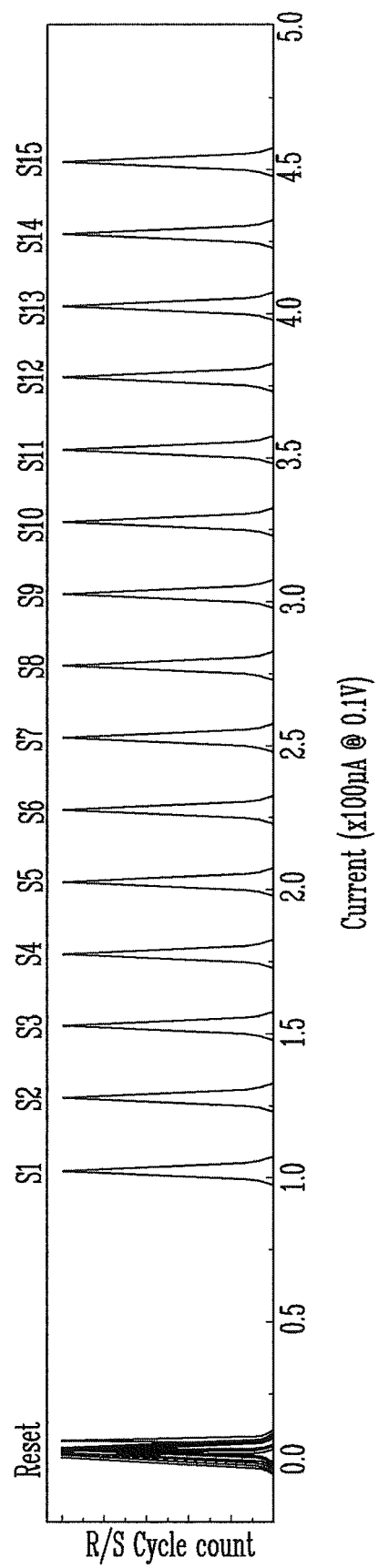

FIGS. 13 and 14 are views illustrating a program distribution of the variable resistance memory cell according to the present disclosure. FIG. 13 is an embodiment in which one variable resistance memory cell stores data of four bits. In this case, the variable resistance memory cell may have any one state among one reset state Rest and fifteen set states S1 to S15.

FIG. 13 illustrates a result obtained by repeatedly performing a reset-set cycle R/S Cycle, using the gradual current-voltage curve characteristic of the self-compliance region of the variable resistance memory cell and the ISPP method. Referring to FIG. 13, it can be seen that the variable resistance memory cell forms a very uniform read current distribution during 100 reset-set cycles in each set state. That is, FIG. 13 illustrates a read current when a voltage of 0.1 V is applied between both ends of the variable resistance memory cell. Such a result may be derived by the ISPP method described with reference to FIG. 8.

It can be seen that the set states form a distribution at the level where adjacent states do not overlap with each other. In other words, the states secure sufficient read margins. This results from that the set operation is performed using the gradual current-voltage curve characteristic of the self-compliance region of the variable resistance memory cell as described above.

The set operation of the variable resistance memory cell according to the present disclosure is performed using the gradual current-voltage curve characteristic of the voltage region having the self-compliance characteristic and the ISPP method, so that multi-bit data can be stably stored in one variable resistance memory cell, thereby implementing high integration of the memory device. At this time, a sequentially increased program pulse may have a voltage level included in the voltage region having the self-compliance characteristic of the variable resistance memory cell.

FIG. 14 illustrates read current values during 100 reset-set cycles with respect to each set state. Referring to FIG. 14, it can be seen that, as a current distribution of the set states is formed narrow, adjacent set states do not overlap with each other. In other words, since the set states secure sufficient read margins, the variable resistance memory cell very stably stores data of four bits. In the graph of FIG. 14, the vertical axis' represents a number of times, where each current value is generated during 100 reset-set cycles.

Referring to FIG. 14, it can be seen that, in a set state having the smallest resistance value, i.e., S15, the read current value does not exceed 100 μA. In other words, 16 resistance states, i.e., one reset state and 15 set states, which may be possessed by the variable resistance memory cell, may be formed within a current window smaller than a maximum of 100 μA. The self-compliance region of the variable resistance memory cell may be designed such that the read current of a set state having the minimum resistance as described above becomes 100 μA or less. The magnitude of the maximum read current is limited under the control of the self-compliance region, which is very important in realizing the low power of a memory device. As an example, the self-compliance region of the variable resistance memory cell is implemented such that the read current of the set state having the smallest resistance value is 100 μA or less. This may be implemented by controlling the material or thickness of the data storage layer 20, the variable resistance layer 201, the insulating layer 202, the oxygen exchange layer 203 or the additional insulating layer 204, which is described with reference to FIG. 1 or 2A to 2D.

Figure 15:
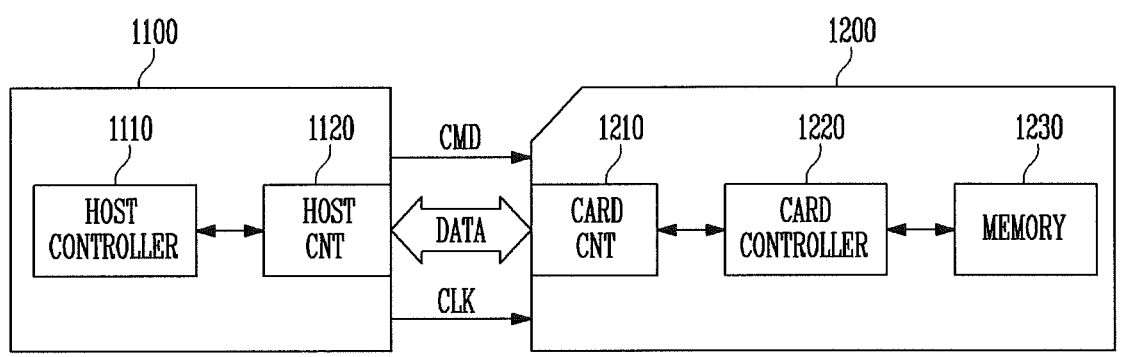
FIG. 15 is a block diagram illustrating an example in which a memory system is applied to a memory card system according to an embodiment of the present disclosure.

FIG. 15 is a block diagram illustrating an example in which a memory system is applied to a memory card system according to an embodiment of the present disclosure.

Referring to FIG. 15, the memory card system 1000 may include a host 1100 and a memory card 1200. The host 1100 may include a host controller 1110 and a host connector 1120. The memory card 1200 may include a card connector 1210, a card controller 1220, and a memory device 1230.

The memory device 1230 may be implemented using the embodiments shown in FIGS. 8 and 9.

The host 1100 may program data in the memory card 1200 or read data stored in the memory card 1200. The host controller 1110 may transmit, to the memory card 1200, a command CMD, a clock signal CLK generated by a clock generator (not shown) in the host 1100, and data DATA through the host connector 1120.

The card controller 1220 may store data in the memory device 1230 in synchronization with a clock signal generated by a clock generator (not shown) in the card controller 1220, in response to a command received through the card connector 1210. The memory device 1230 may store data transmitted from the host 1100.

The memory card 1200 may be implemented with a Compact Flash Card (CFC), a Microdrive, a Smart Media Card (SMC), a Multi-Media Card (MMC), a Security Digital Card (SDC), a memory stick, a USB flash memory driver, etc.

Figure 16:
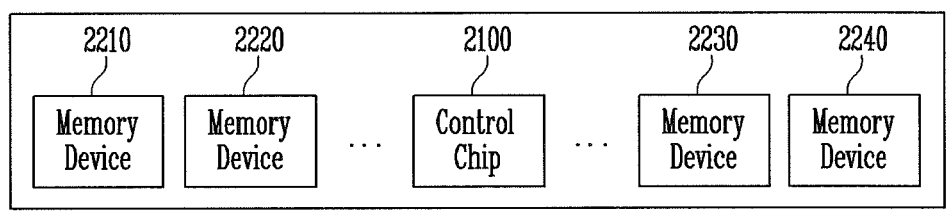
FIG. 16 is a view illustrating a variable resistance memory module according to an embodiment of the present disclosure.

FIG. 16 is a view illustrating a variable resistance memory module according to an embodiment of the present disclosure.

Referring to FIG. 16, the memory module 2000 may include memory devices 2210 to 2240 and a control chip 2100. Each of the memory devices 2210 to 2240 may be implemented using the embodiments shown in FIGS. 8 and 9.

The control chip 2100 may control the memory devices 2210 to 2240 in response to various signals transmitted from an external memory controller. For example, the control chip 2100 may control program and read operations by activating the memory devices 2210 to 2240 corresponding to various commands and addresses transmitted from the outside. Also, the control chip 2100 may perform various sequent operations on read data output from each of the memory devices 2210 to 2240. For example, the control chip 2100 may perform error detection and correction operations on the read data. Also, the control chip 2100 may control the memory devices 2210 to 2240 to adjust the number of inhibit voltages generated from each of the memory devices 2210 to 2240 or a difference between the inhibit voltages.

Figure 17:
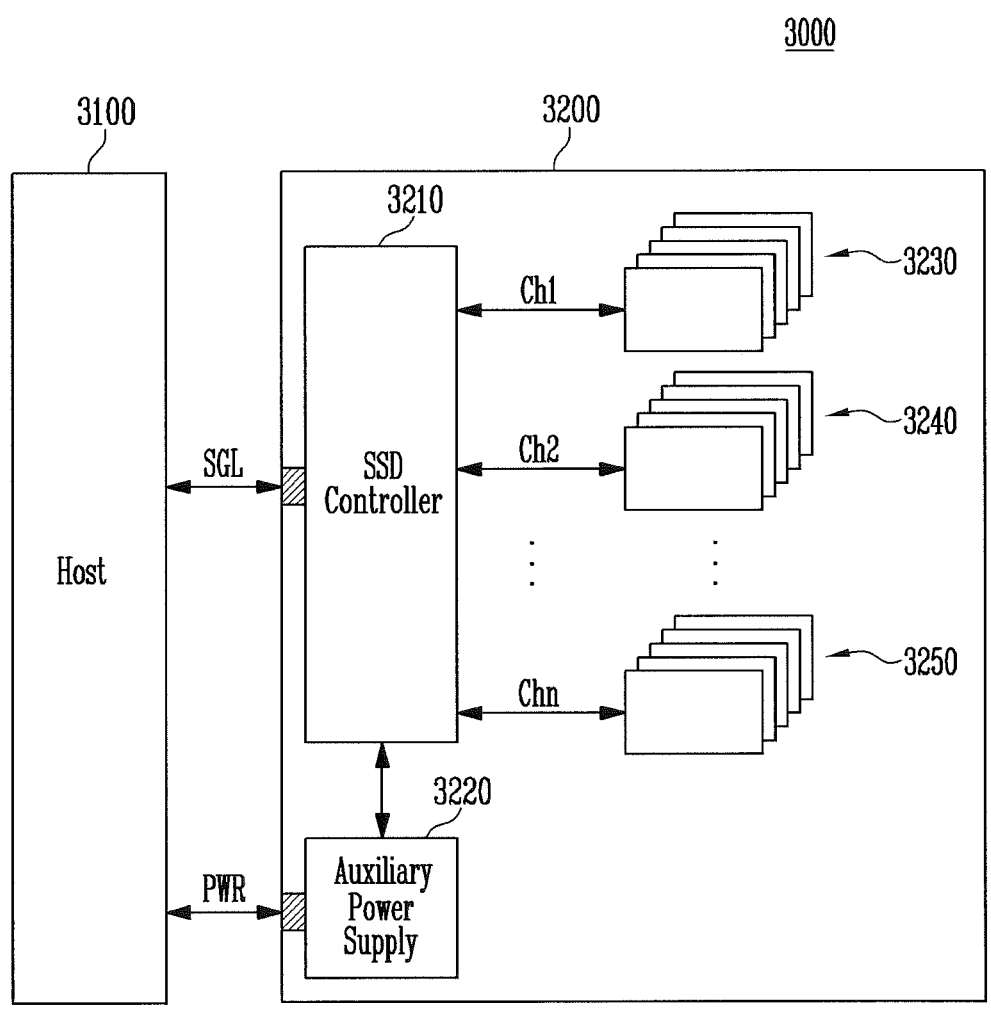
FIG. 17 is a block diagram illustrating an example in which a memory system is applied to an SSD system according to an embodiment of the present disclosure.

FIG. 17 is a block diagram illustrating an example in which a memory system is applied to an SSD system according to an embodiment of the present disclosure.

Referring to FIG. 17, the SSD system 3000 may include a host 3100 and an SSD 3200. The SSD 3200 transmits/receives a signal to/from the host 3100 through a signal connector, and receives power through a power connector. The SSD 3200 may include an SSD controller 3210, an auxiliary power supply 3220, and a plurality of memory devices 3230, 3240, and 3250. At this time, the plurality of memory devices 3230, 3240, and 3250 may be implemented using the embodiments shown in FIGS. 8 and 9.

Figure 18:
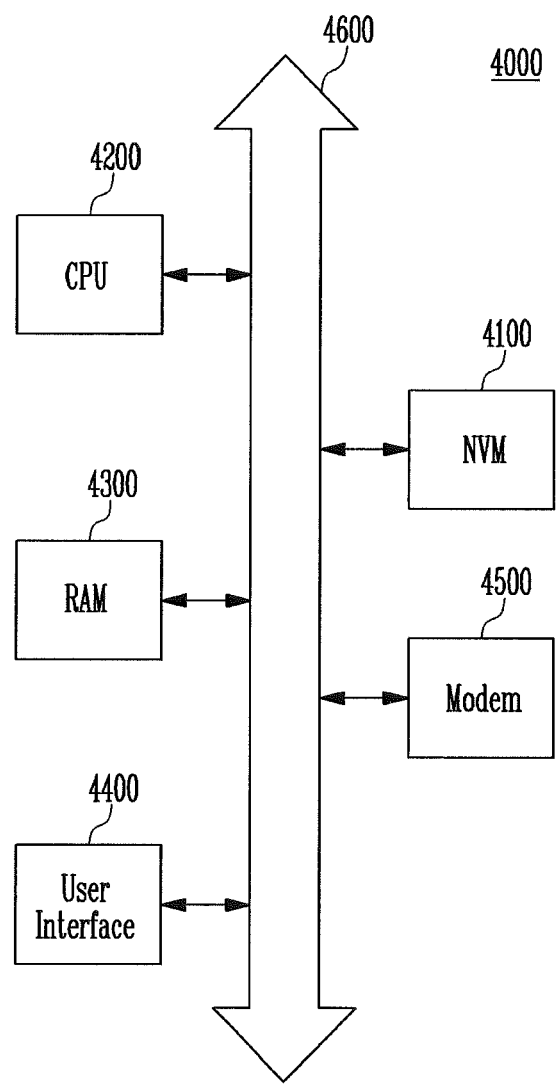
FIG. 18 is a block diagram illustrating a computing system including a memory system according to an embodiment of the present disclosure.

FIG. 18 is a block diagram illustrating a computing system including a nonvolatile memory system according to an embodiment of the present disclosure.

The computing system 4000 according to the present disclosure includes a nonvolatile memory device 4100, a microprocessor 4200, a RAM 4300, a user interface 4400, and a modem 4500 such as a baseband chipset, which are electrically coupled to a system bus 4600. Here, the nonvolatile memory device 4100 includes overwritable variable resistance memory cells. According to the embodiment of the present disclosure, the nonvolatile memory device 4100 may include variable resistance memory cells for storing multi-bit data. In addition, multi-bit data can be stably stored in the variable resistance memory cells by a set operation method using the gradual current-voltage curve characteristic of the self-compliance region.

When the computing system 4000 according to the present disclosure is a mobile device, a battery (not shown) for supplying an operation voltage to the computing system 4000 may be further provided. Although not shown in the drawing, it will be apparent to those skilled in the art that an application chip set, a camera image processor (CIS), a mobile D-RAM, and the like may be further provided.

The variable resistance memory device according to the present disclosure may be packaged in various forms. For example, the variable resistance memory device according to the present disclosure may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

In the variable resistance memory device and the operating method thereof according to the present disclosure, the resistance distribution of the variable resistance memory cell can be easily controlled using the self-compliance characteristic of the variable resistance memory cell and a sequentially increased program voltage pulse in a program operation. Thus, it is possible to implement a multi-bit variable resistance memory device having high reliability and high capacity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for operating a variable resistance memory device, the method comprising:
   programming multi-bit data in a multi-bit variable resistance memory cell of the variable resistance memory device, the programming being performed in a set operation and a reset operation, wherein the multi-bit variable resistance memory cell is programmed from a first resistance state to a second resistance state in the set operation and the multi-bit variable resistance memory cell is programmed from a third resistance state to a fourth resistance state in the reset operation, wherein a resistance of the first resistance state is higher than a resistance of the second resistance state while a resistance of the third resistance state is lower than a resistance of the fourth resistance state,
   wherein the programming includes:
   generating sequentially increased program voltage pulses, based on the multi-bit data; and applying the program voltage pulses to the multi-bit variable resistance memory cell, wherein a current-voltage curve of the multi-bit variable resistance memory cell in the set operation includes a first region that does not exhibit a distinguishable hysteresis characteristic and a second region that exhibits both a hysteresis characteristic and a self-compliance characteristic, the current-voltage curve in the set operation in the second region being more gradual than the current-voltage curve in the set operation in the first region such that an increasement of a current per an increment of the applied program voltage pulses in the second region is greater than an increasement of a current per an increment of the applied program voltage pulses in the first region, wherein the program voltage pulses are applied to the multi-bit variable resistance memory cell in the second region of the current-voltage curve of the multi-bit variable resistance memory cell, wherein the variable resistance memory cell includes a variable resistance element and a first resistor coupled to the variable resistance element, wherein the self-compliance characteristic is generated by the variable resistance element and the first resistor.

2. The method of claim 1, wherein the multi-bit variable resistance memory cell exhibits a random characteristic in which the multi-bit variable resistance memory cell is set to different resistance values by the program voltage pulses during a plurality of reset-set cycles.

3. The method of claim 1, wherein the programming includes performing a verify read operation on the multi-bit variable resistance memory cell, wherein the verify read operation is determined as program pass when a read current flowing through the multi-bit variable resistance memory cell is larger than a minimum current limit and is smaller than a maximum current limit.

4. The method of claim 3, wherein, when the read current is larger than the maximum current limit, the multi-bit variable resistance memory cell is reset, and the program voltage pulses are then re-applied.

5. The method of claim 3, wherein a voltage applied to the multi-bit variable resistance memory cell during the verify read operation has a phase opposite to that of the program voltage pulses.

6. The method of claim 3, wherein the read current is 100 µA or less in the verify read operation.

7. A variable resistance memory device comprising:
a variable resistance memory cell configured to store multi-bit data;
a voltage generator configured to generate sequentially increased program voltage pulses, based on the multi-bit data;
a program circuit configured to perform a program operation on the variable resistance memory cell by applying the program voltage pulses to the variable resistance memory cell, the programming operation being performed in a set operation and a reset operation, wherein the multi-bit variable resistance memory cell is programmed from a first resistance state to a second resistance state in the set operation and the multi-bit variable resistance memory cell is programmed from a third resistance state to a fourth resistance state in the reset operation, wherein a resistance of the first resistance state is higher than a resistance of the second resistance state while a resistance of the third resistance state is lower than a resistance of the fourth resistance state; and
a read circuit configured to perform a verify read operation on the variable resistance memory cell,
wherein a current-voltage curve of the variable resistance memory cell in the set operation includes a first region that does not exhibit a distinguishable hysteresis characteristic and a second region that exhibits both a hysteresis and a self-compliance characteristic, the current-voltage curve in the set operation in the second region being more gradual than the current-voltage curve in the set operation in the first region such that an increasement of a current per an increment of the applied program voltage pulses in the second region is greater than an increasement of a current per an increment of the applied program voltage pulses in the first region,
wherein the program voltage pulses are applied to the variable resistance memory cell in the second region of the current-voltage curve of the variable resistance memory cell,
wherein the read circuit is configured to determine the verify read operation as program pass when a read current of the variable resistance memory cell is larger than a minimum current limit and is smaller than a maximum current limit,
wherein the variable resistance memory cell includes a variable resistance element and a first resistor coupled to the variable resistance element,
wherein the self-compliance characteristic is generated by the variable resistance element and the first resistor.

8. The variable resistance memory device of claim 7, wherein the variable resistance memory cell is programmed to any one of a plurality of set states in response to the program voltage pulses,
wherein the read current in a set state having the smallest resistance value among the plurality of set states is smaller than 100 µA.

9. The variable resistance memory device of claim 7, wherein the multi-bit data has four bits.

10. A variable resistance memory device comprising:
a variable resistance memory cell configured to store multi-bit data;
a voltage generator configured to generate sequentially increased program voltage pulses, based on the multi-bit data;
a program circuit configured to perform a program operation on the variable resistance memory cell by applying the program voltage pulses to the variable resistance memory cell, the programming operation being performed in a set operation and a reset operation, wherein the multi-bit variable resistance memory cell is programmed from a first resistance state to a second resistance state in the set operation and the multi-bit variable resistance memory cell is programmed from a third resistance state to a fourth resistance state in the reset operation, wherein a resistance of the first resistance state is higher than a resistance of the second resistance state while a resistance of the third resistance state is lower than a resistance of the fourth resistance state; and
a read circuit configured to perform a verify read operation on the variable resistance memory cell,
wherein a current-voltage curve of the variable resistance memory cell in the set operation includes a first region that does not exhibit a distinguishable hysteresis characteristic and a second region that exhibits both a hysteresis and a self-compliance characteristic, the current-voltage curve in the set operation in the second region being more gradual than the current-voltage curve in the set operation in the first region such that an increasement of a current per an increment of the applied program voltage pulses in the second region is greater than an increasement of a current per an increment of the applied program voltage pulses in the first region, wherein the program voltage pulses are applied to the variable resistance memory cell in the second region of the current-voltage curve of the variable resistance memory cell, wherein the read circuit is configured to determine the verify read operation as program pass when a read current of the variable resistance memory cell is larger than a minimum current limit and is smaller than a maximum current limit, wherein the variable resistance memory cell includes a variable resistance element and a first resistor or transistor coupled to the variable resistance element, wherein the self-compliance characteristic is generated by the variable resistance element and the first resistor or the transistor.

11. The method of claim 1, wherein the current-voltage curve of the multi-bit variable resistance memory cell in the set operation and the current-voltage curve of the multi-bit variable resistance memory cell in the reset operation both exhibiting the self-compliance characteristic, wherein the current-voltage curve of the multi-bit variable resistance memory cell in the set operation and the current-voltage curve of the multi-bit variable resistance memory cell in the reset operation are asymmetric.

12. The variable resistance memory device of claim 7, wherein the current-voltage curve of the multi-bit variable resistance memory cell in the set operation and the current-voltage curve of the multi-bit variable resistance memory cell in the reset operation both exhibiting the self-compliance characteristic, wherein the current-voltage curve of the multi-bit variable resistance memory cell in the set operation and the current-voltage curve of the multi-bit variable resistance memory cell in the reset operation are asymmetric.

13. The variable resistance memory device of claim 10, wherein the current-voltage curve of the multi-bit variable resistance memory cell in the set operation and the current-voltage curve of the multi-bit variable resistance memory cell in the reset operation both exhibiting the self-compliance characteristic, wherein the current-voltage curve of the multi-bit variable resistance memory cell in the set operation and the current-voltage curve of the multi-bit variable resistance memory cell in the reset operation are asymmetric.

* * * * *